US011839037B2

(12) United States Patent
Kang et al.

(10) Patent No.: US 11,839,037 B2
(45) Date of Patent: Dec. 5, 2023

(54) DISPLAY DEVICE

(71) Applicant: LG ELECTRONICS INC., Seoul (KR)

(72) Inventors: Kitae Kang, Seoul (KR); Dohyeon Kim, Seoul (KR); Sangdon Park, Seoul (KR); Dongha Yang, Seoul (KR)

(73) Assignee: LG ELECTRONICS INC., Seoul (KR)

(*) Notice: Subject to any disclaimer, the term of this patent is extended or adjusted under 35 U.S.C. 154(b) by 280 days.

(21) Appl. No.: 17/292,330

(22) PCT Filed: Jan. 25, 2019

(86) PCT No.: PCT/KR2019/001073
§ 371 (c)(1),
(2) Date: May 7, 2021

(87) PCT Pub. No.: WO2020/153518
PCT Pub. Date: Jul. 30, 2020

(65) Prior Publication Data
US 2021/0400827 A1 Dec. 23, 2021

(51) Int. Cl.
H05K 5/00 (2006.01)
H05K 5/02 (2006.01)
H10K 59/00 (2023.01)

(52) U.S. Cl.
CPC ......... H05K 5/0217 (2013.01); H05K 5/0017 (2013.01); H10K 59/00 (2023.02)

(58) Field of Classification Search
CPC ... H05K 5/0017; H05K 5/0217; H05K 5/0021

USPC ....................................................... 361/807
See application file for complete search history.

(56) References Cited

U.S. PATENT DOCUMENTS

2019/0180673 A1* 6/2019 Yoon .................... G09F 9/3026

FOREIGN PATENT DOCUMENTS

| KR | 1020110001438 | 1/2011 |
| KR | 101202806 | 11/2012 |
| KR | 1020180061518 | 6/2018 |
| KR | 101917075 | 11/2018 |
| WO | 2017191440 | 11/2017 |

OTHER PUBLICATIONS

PCT International Application No. PCT/KR2019/001073, International Search Report dated Oct. 22, 2019, 3 pages.

* cited by examiner

Primary Examiner — Hung S. Bui
(74) Attorney, Agent, or Firm — LEE, HONG, DEGERMAN, KANG & WAIMEY PC

(57) ABSTRACT

The present invention relates to a display device. The display device according to an embodiment of the present invention can comprise: a display module; a reinforcement frame provided to the display module; a hook fastened to the reinforcement frame; a mounting bracket having a catching hole in which the hook is caught; a screw coming into contact with the upper surface or the lower surface of the reinforcement frame; and a screw fastening part which is provided to the reinforcement frame and to which the screw is fastened.

12 Claims, 24 Drawing Sheets

[Fig. 1]
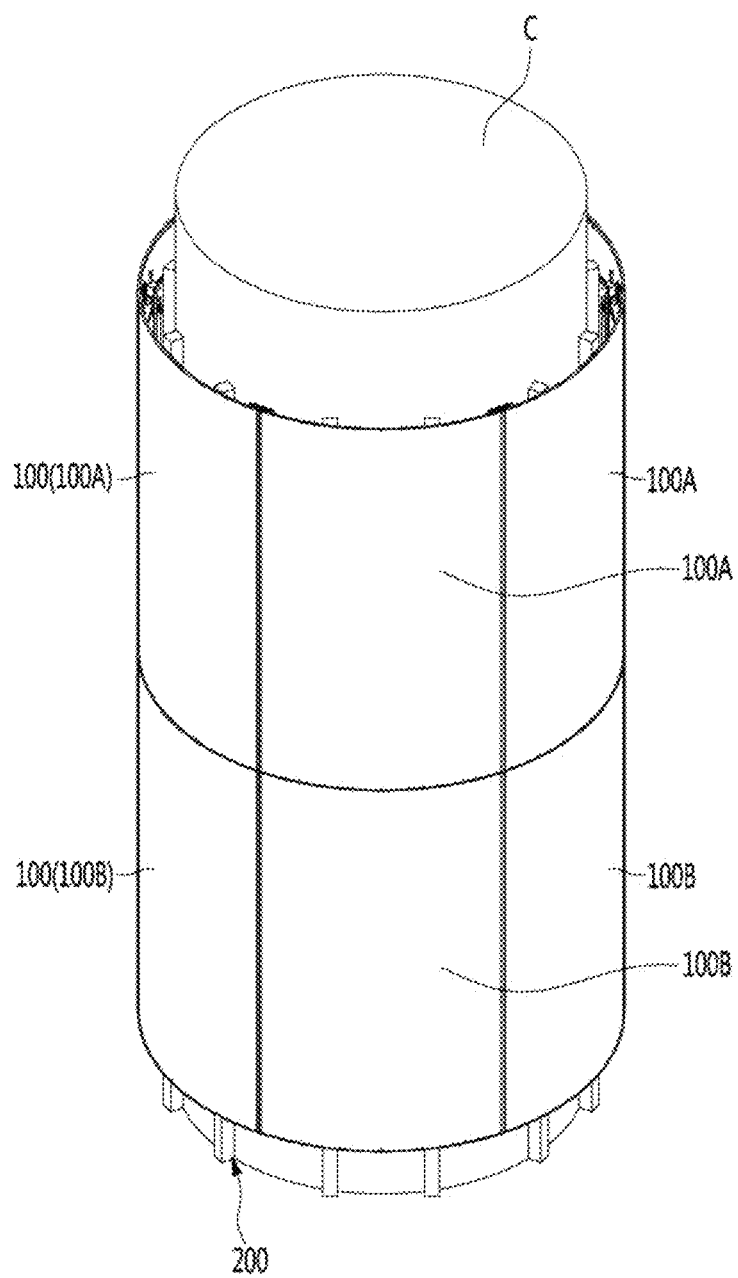

[Fig. 2]
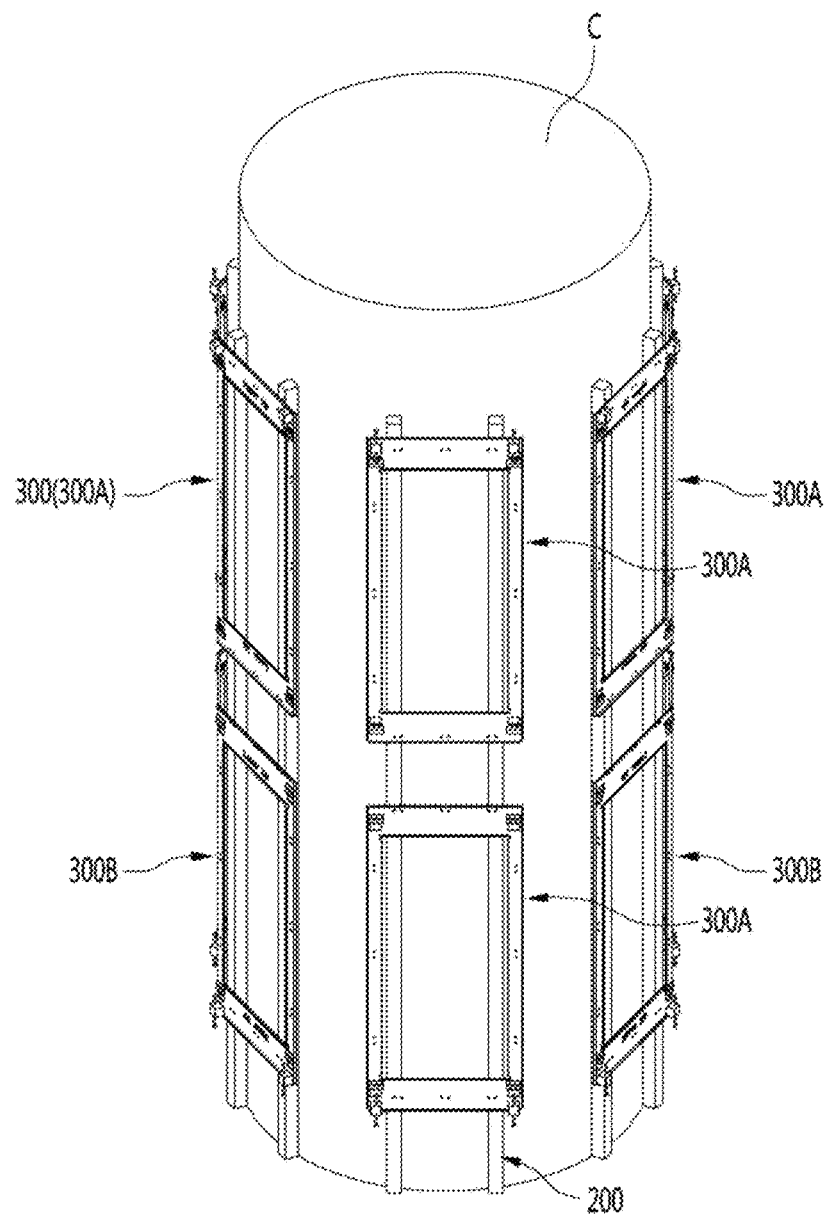

[Fig. 3]
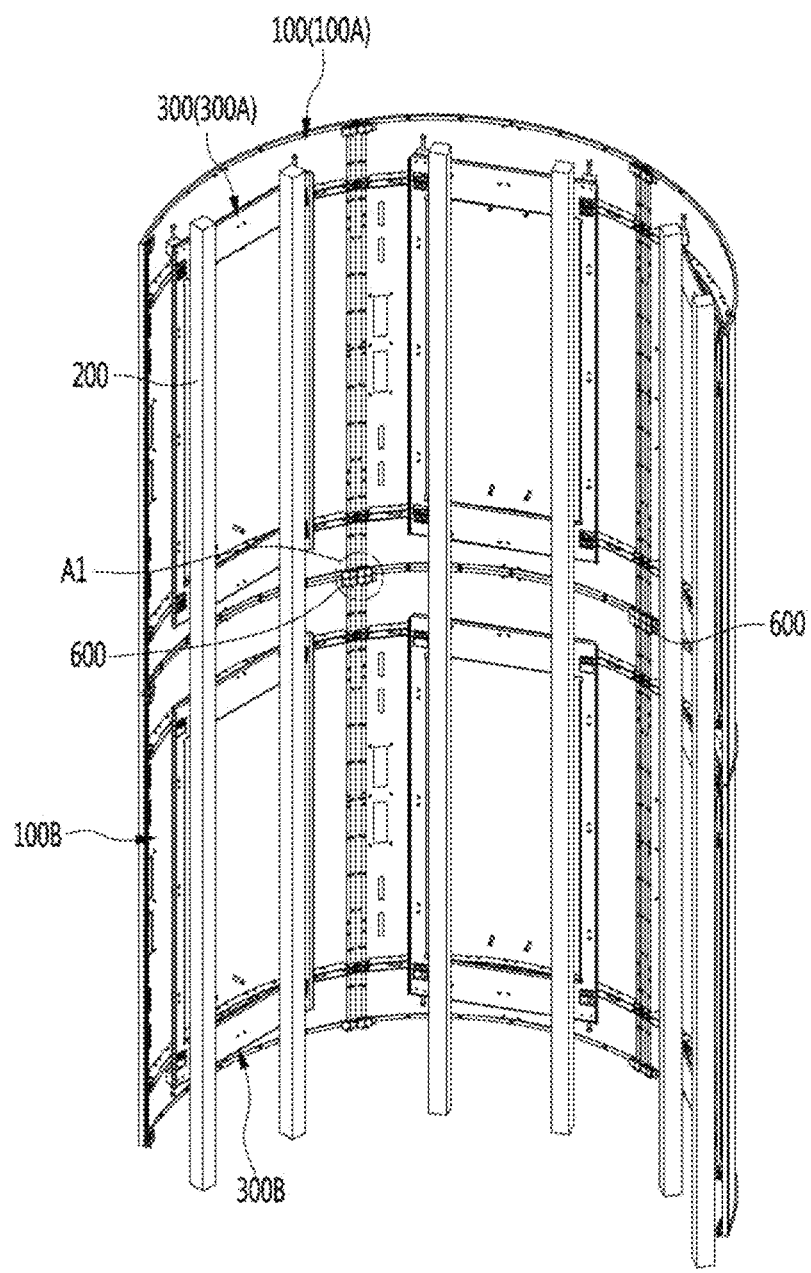

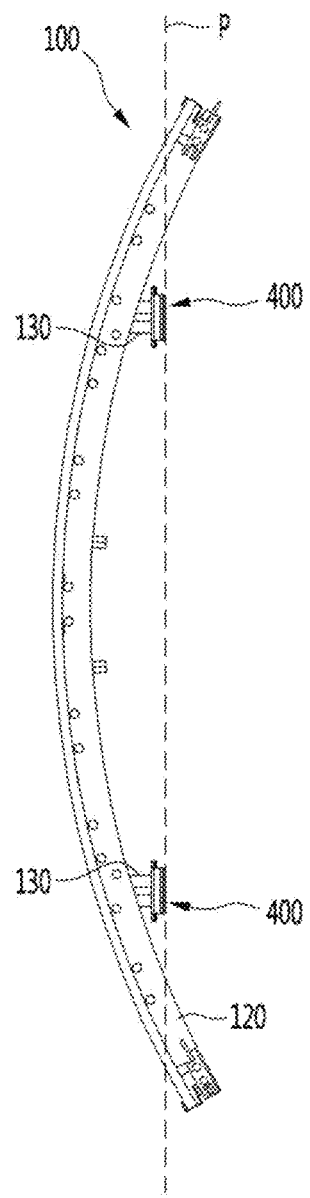
[Fig. 4]

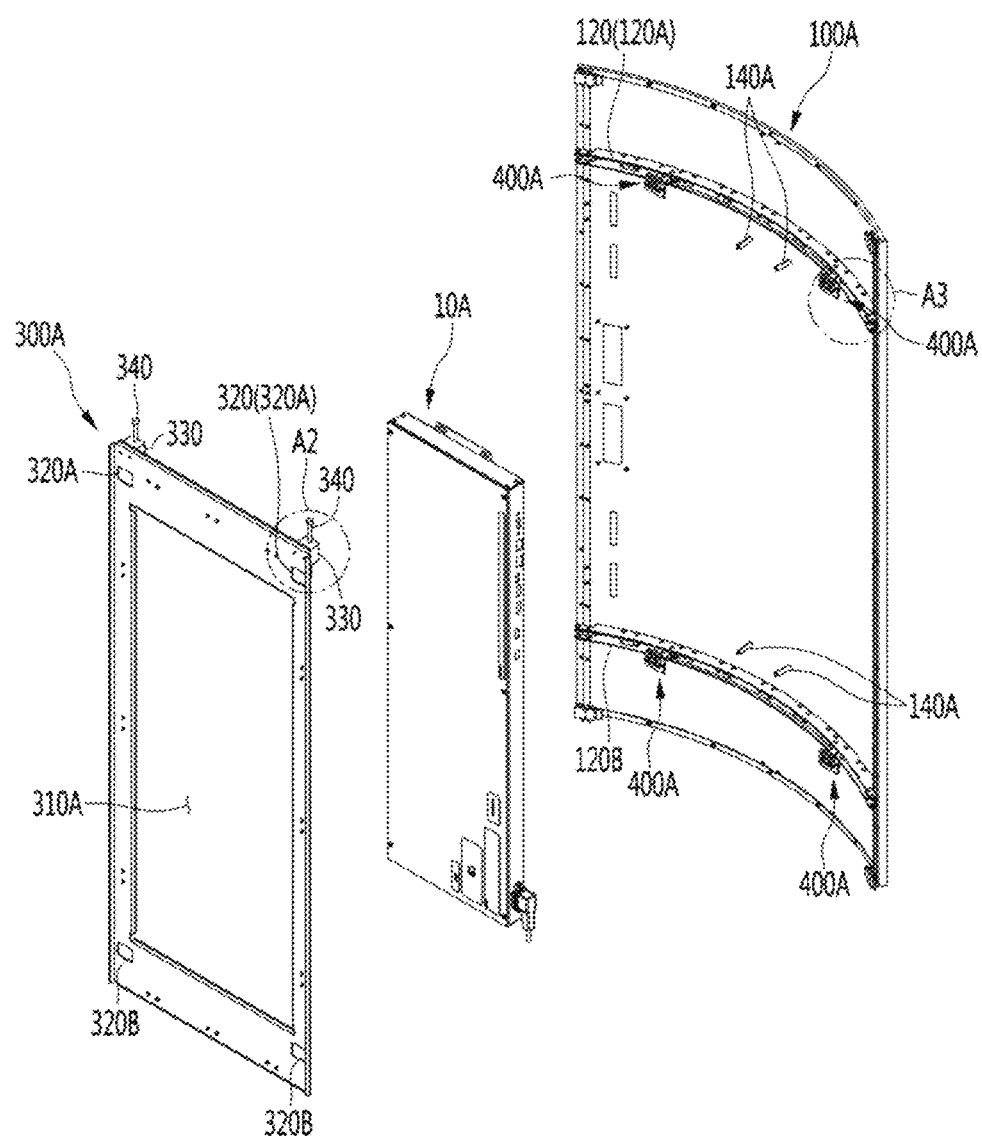
[Fig. 5]

[Fig. 6]
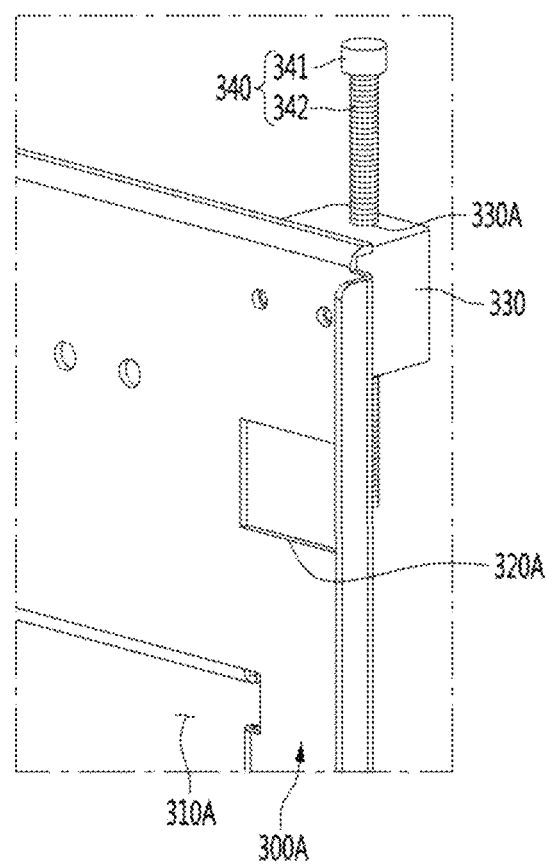

[Fig. 7]
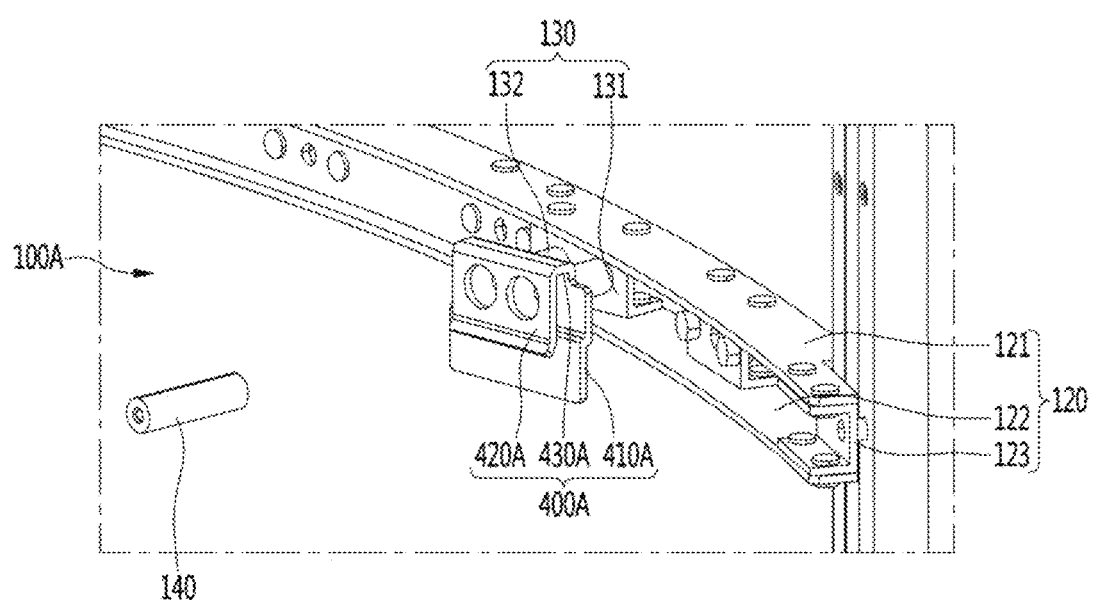

[Fig. 8]
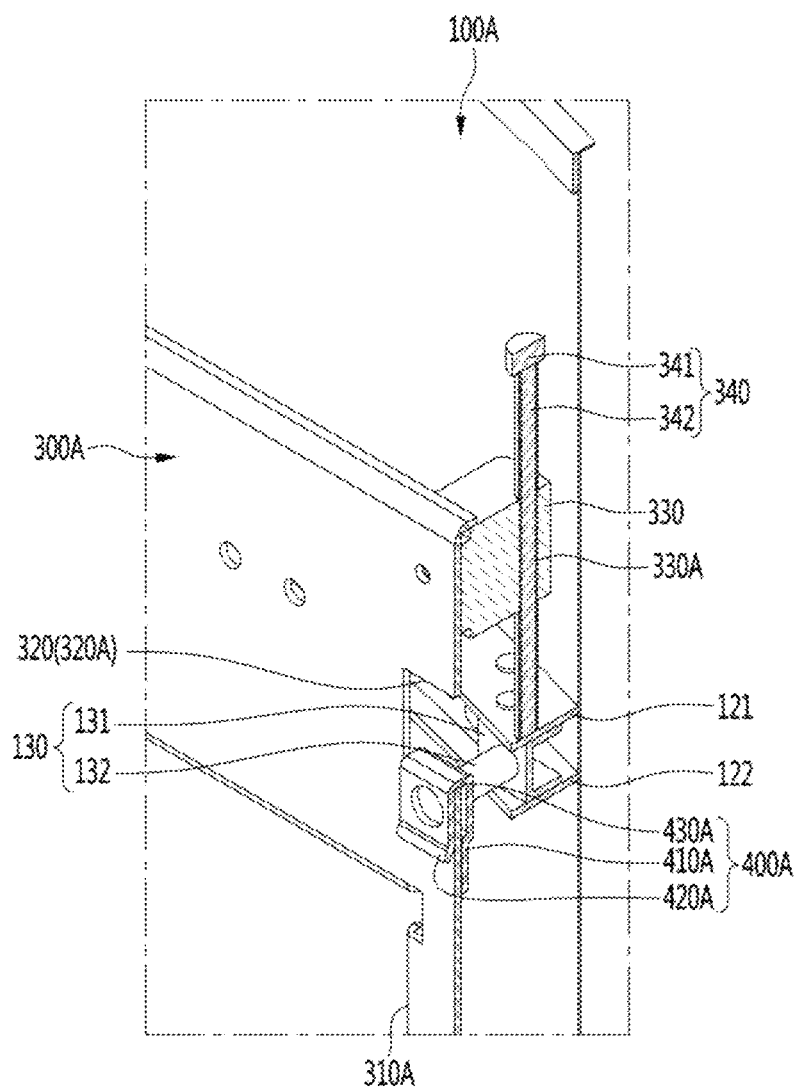

[Fig. 9a]
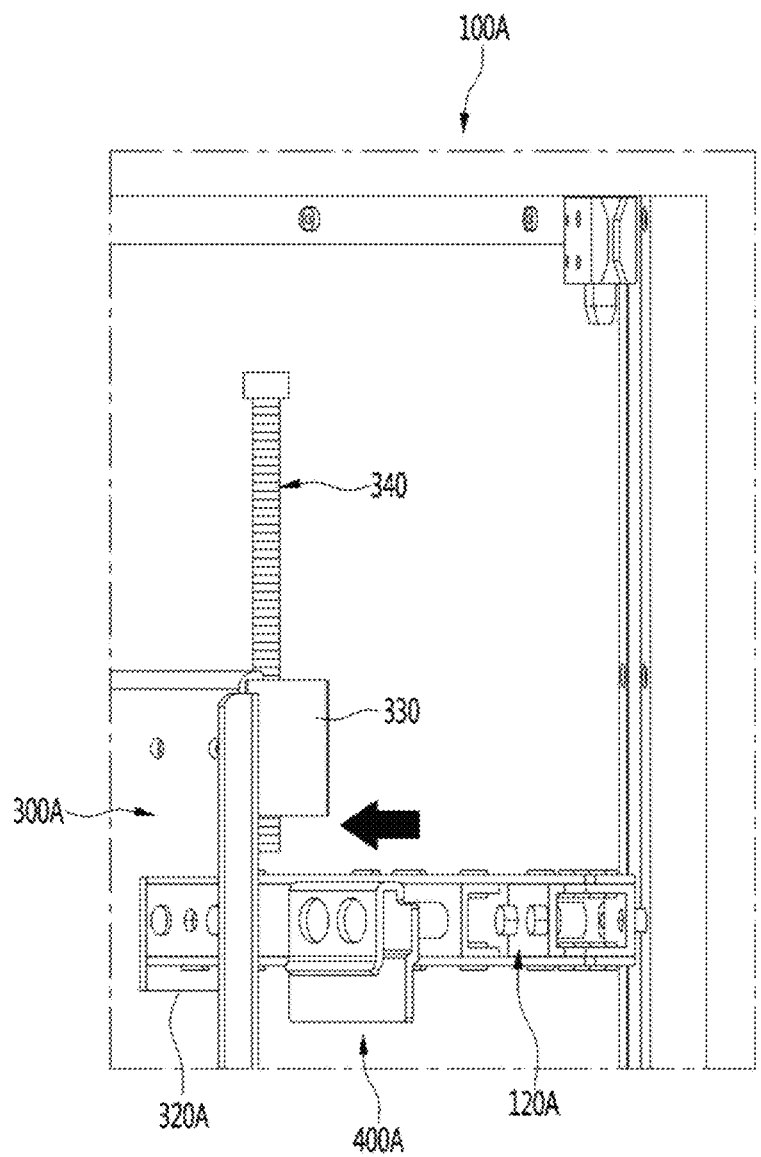

[Fig. 9b]
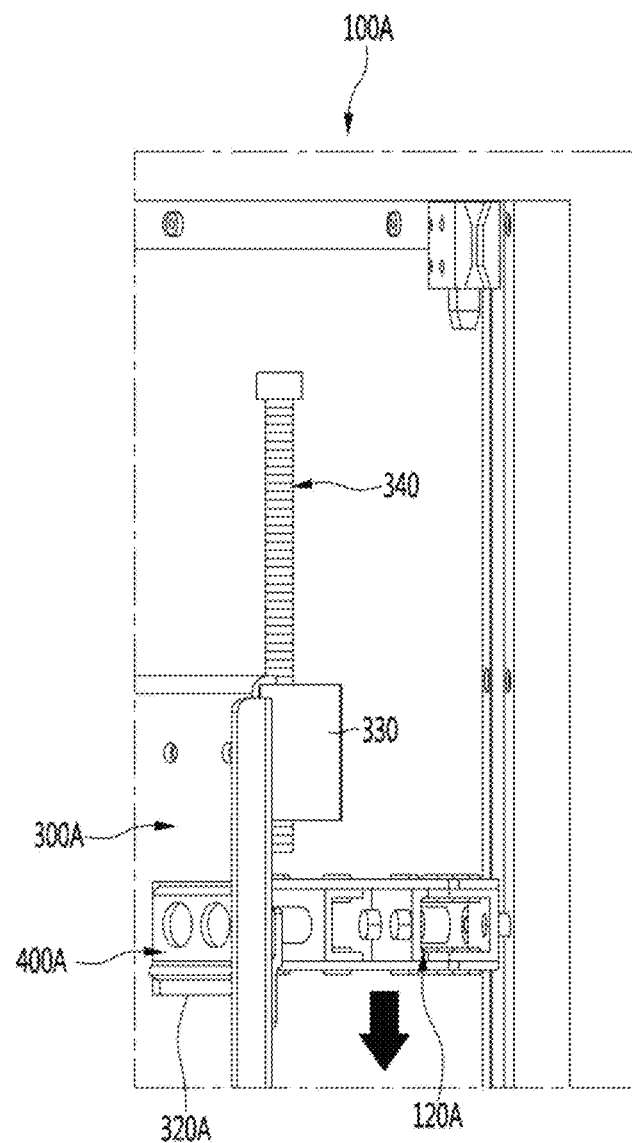

[Fig. 9c]
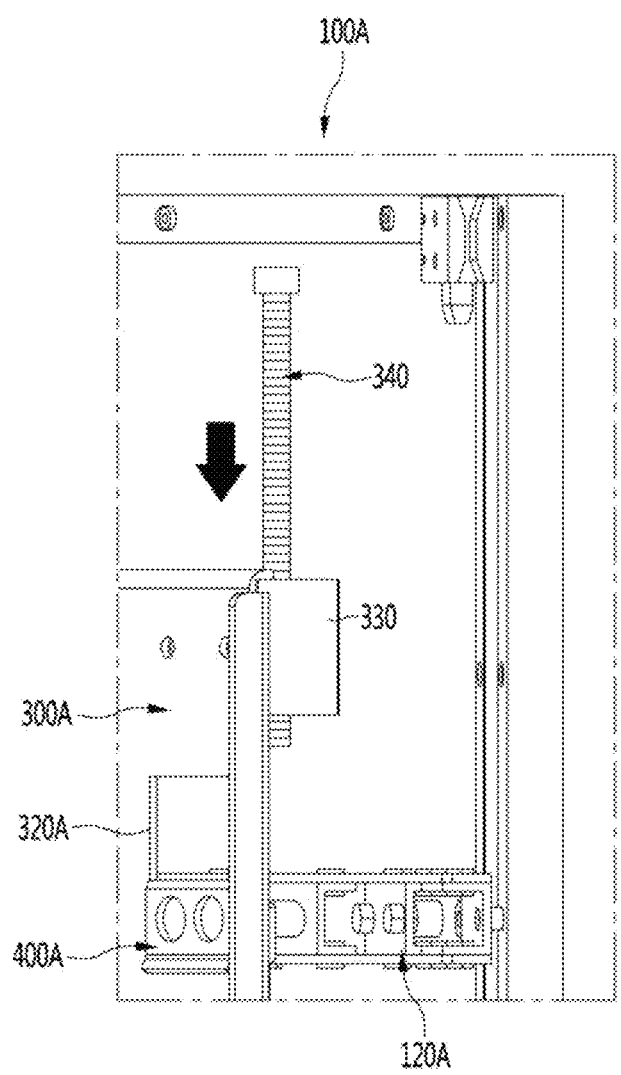

[Fig. 9d]
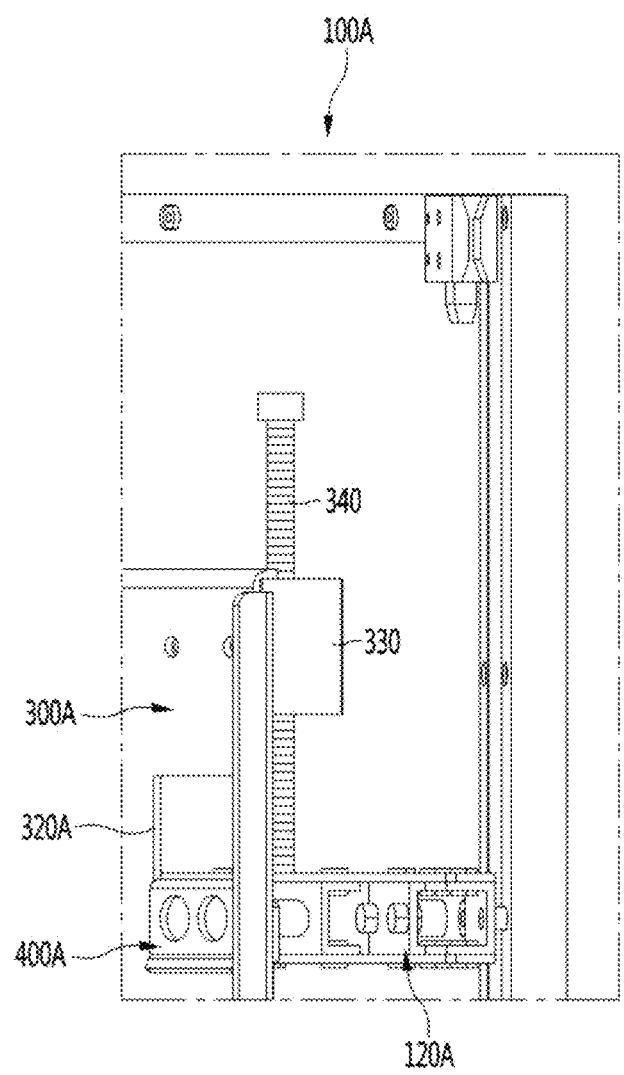

[Fig. 10]
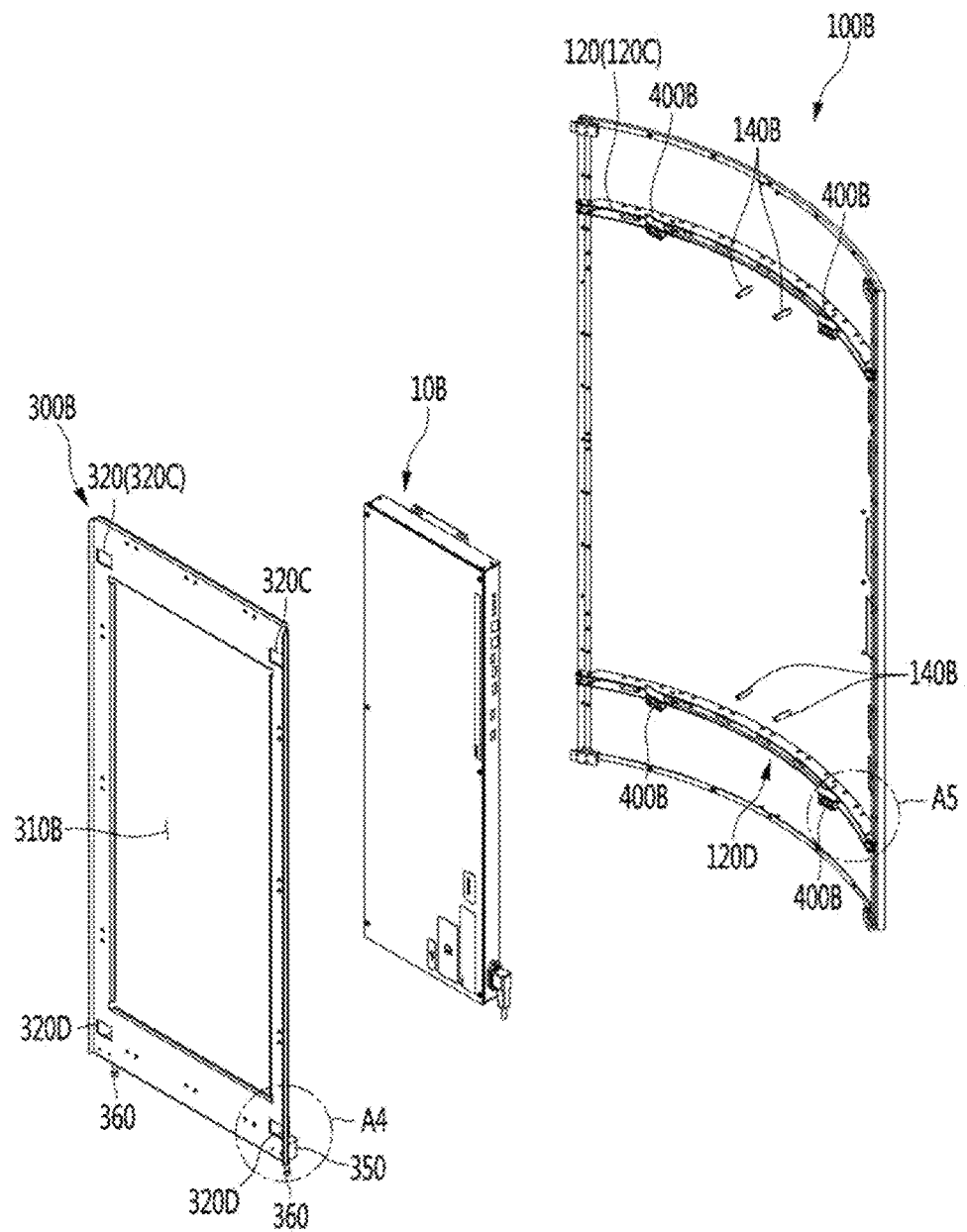

[Fig. 11]
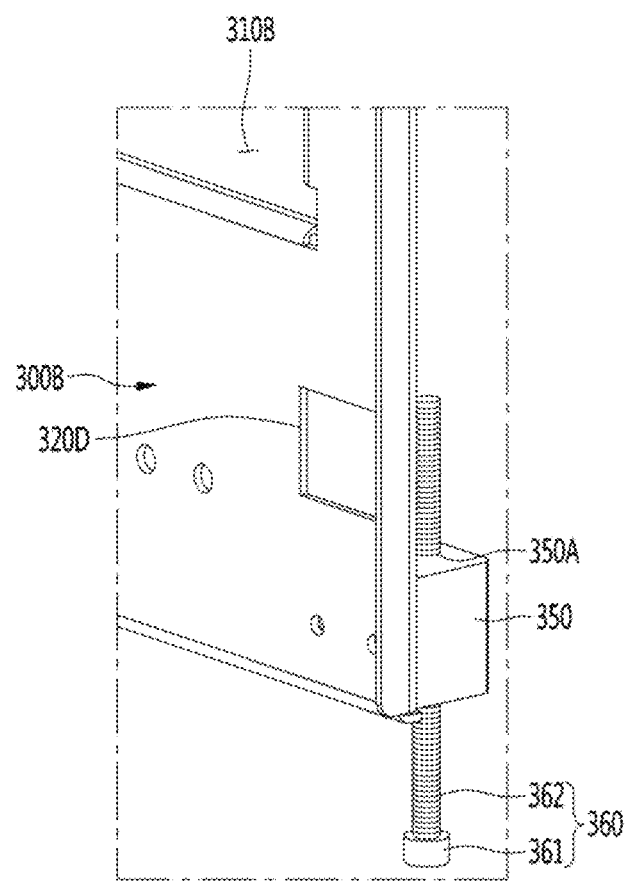

[Fig. 12]
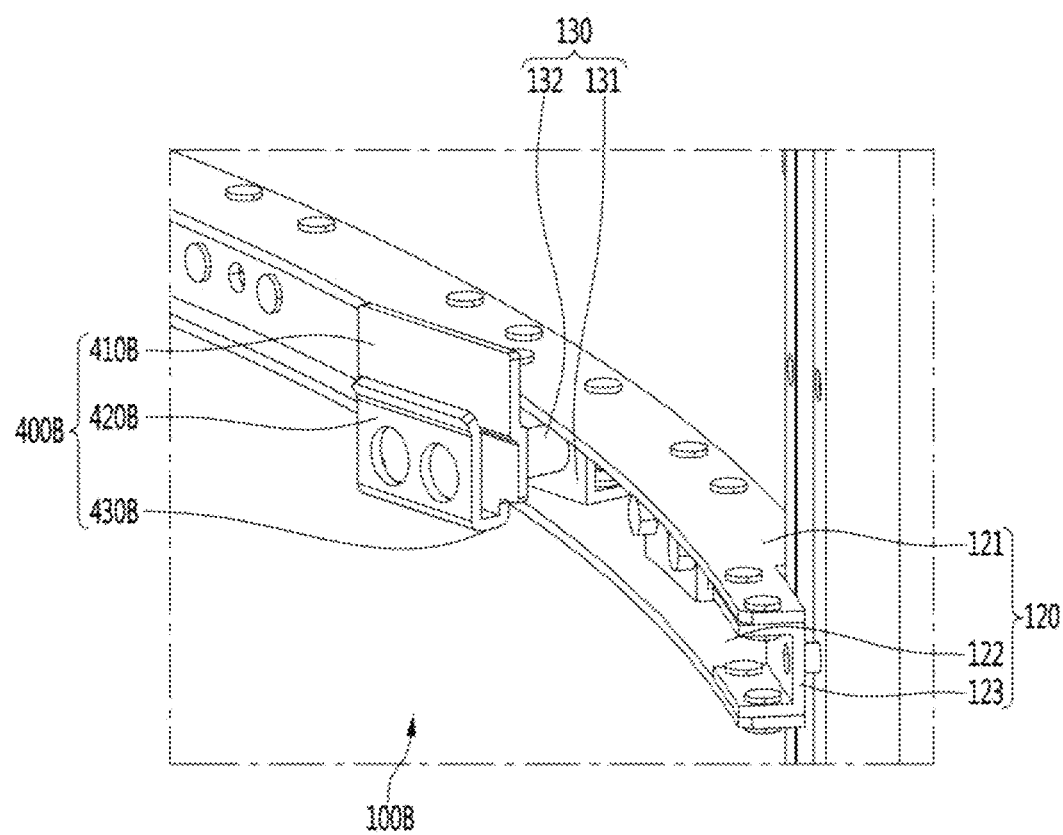

[Fig. 13]
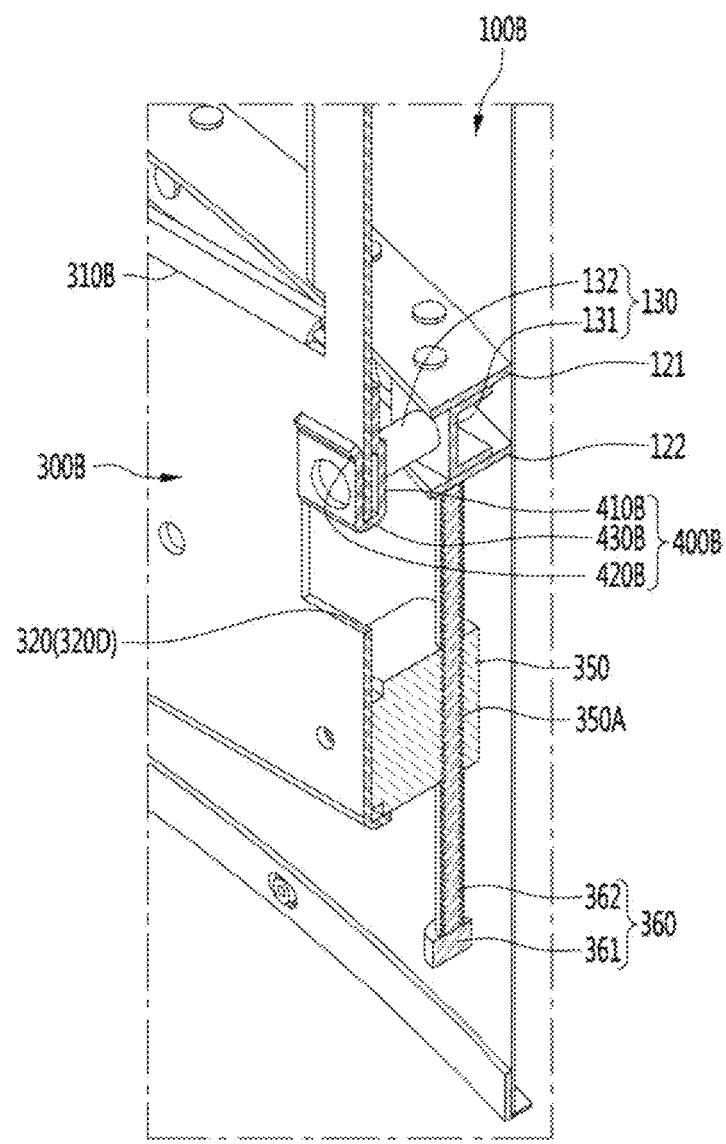

[Fig. 14a]
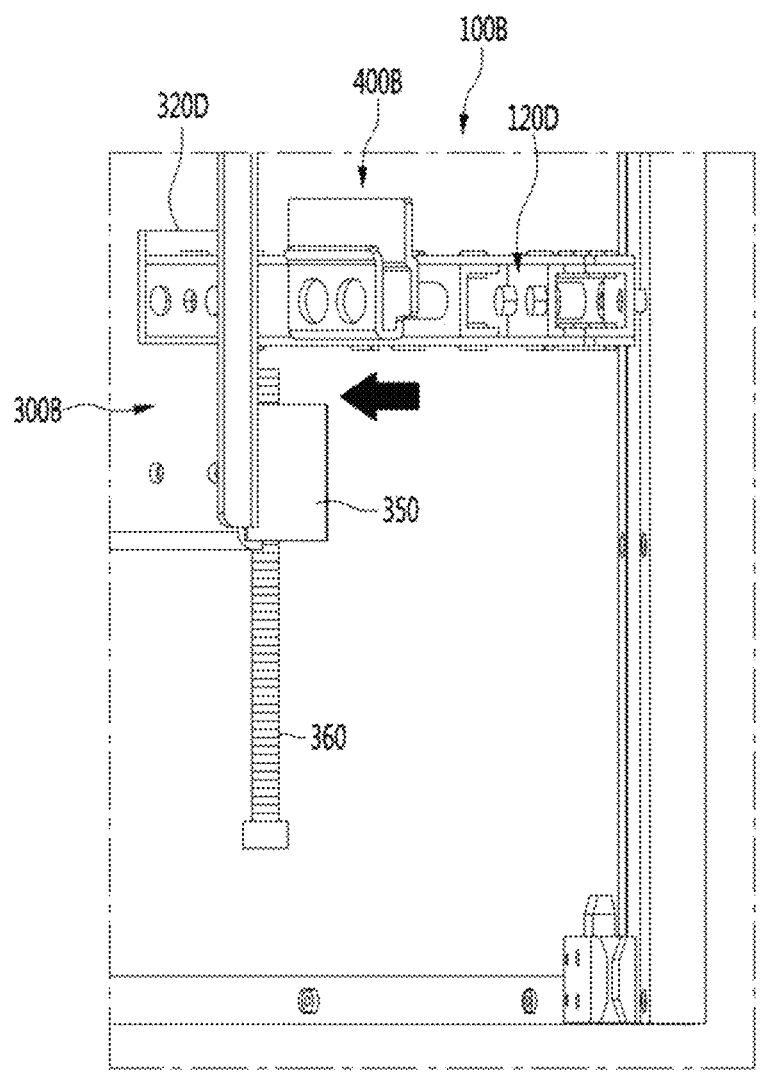

[Fig. 14b]
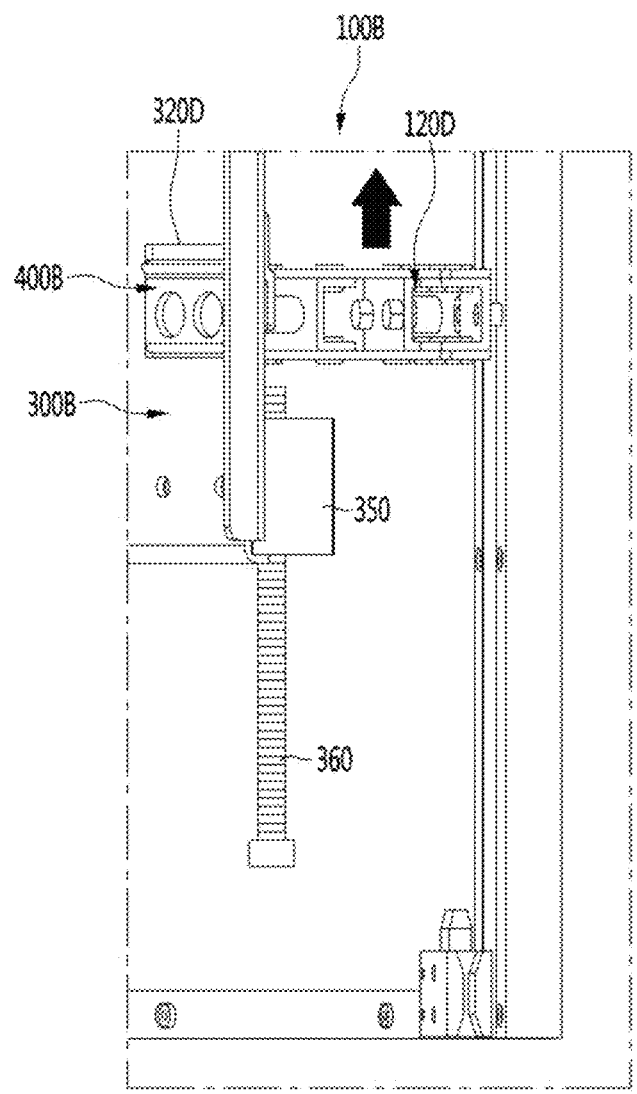

[Fig. 14c]
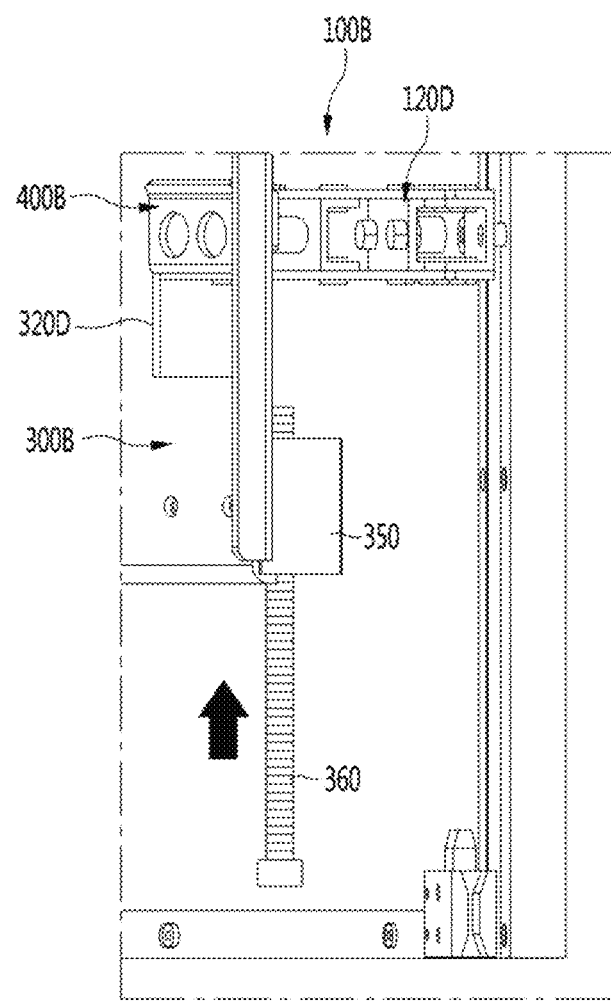

[Fig. 14d]
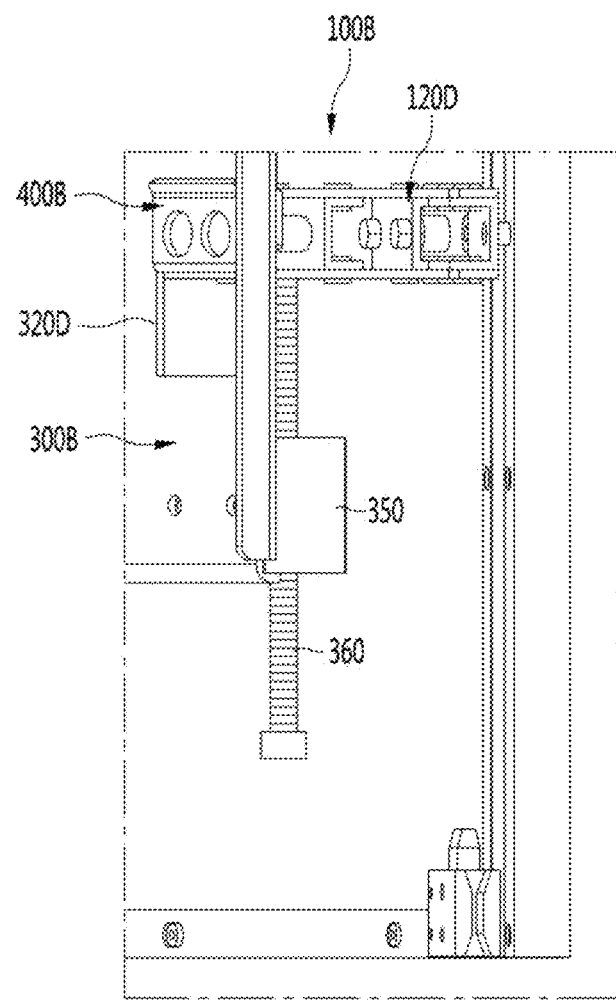

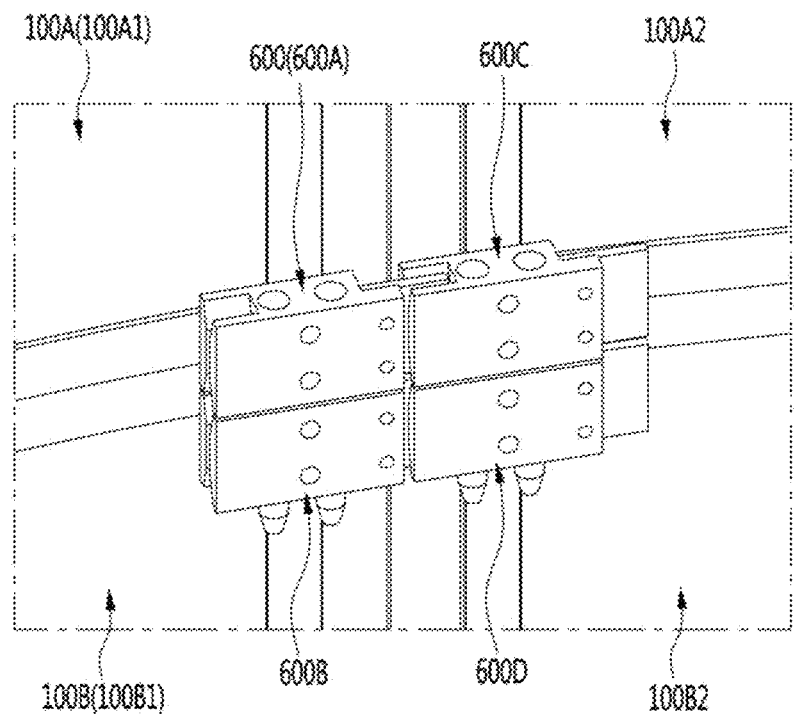
[Fig. 15]

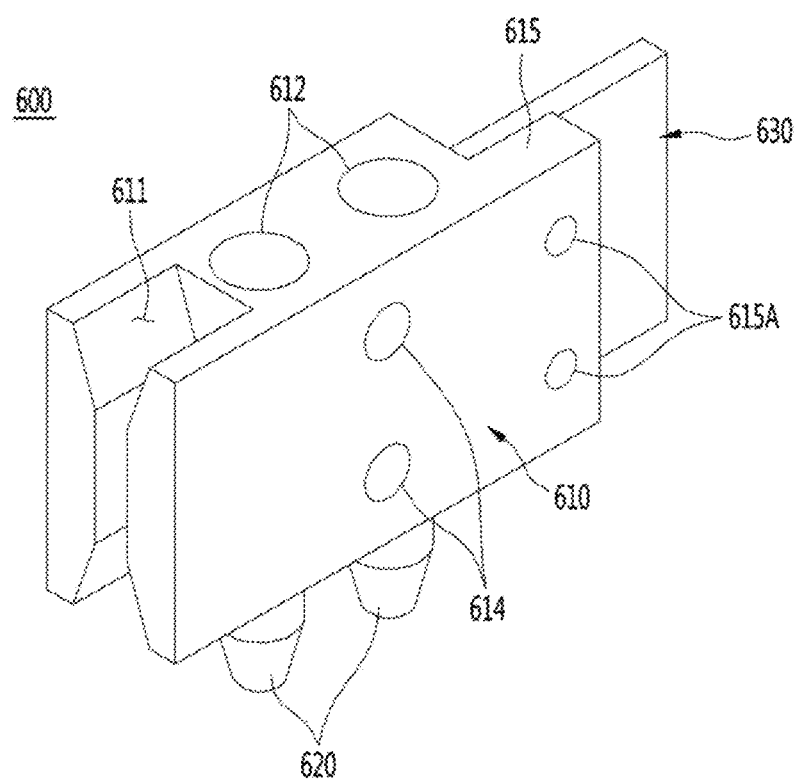
[Fig. 16]

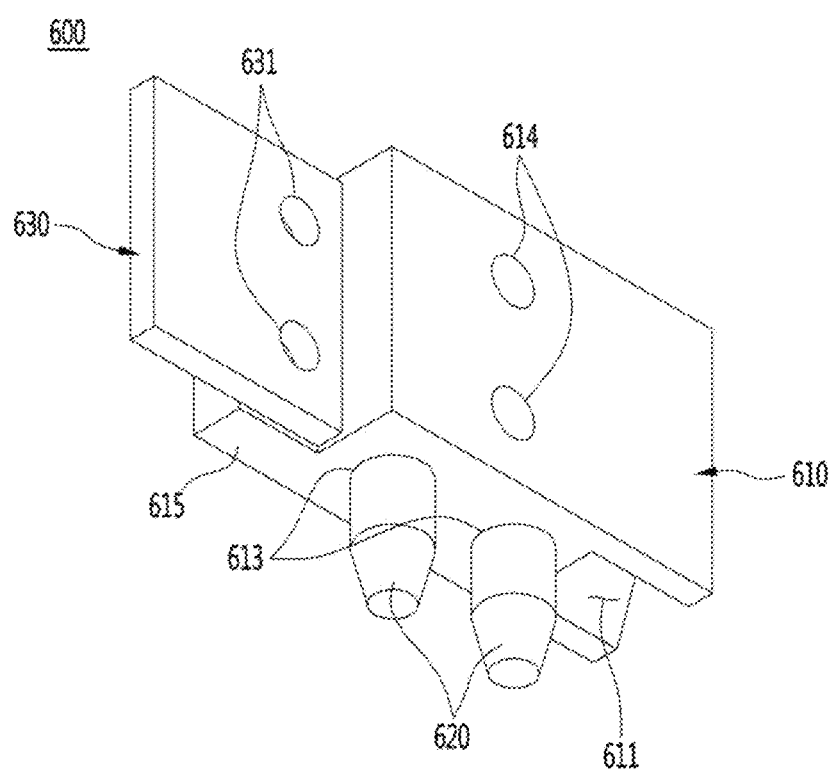
[Fig. 17]

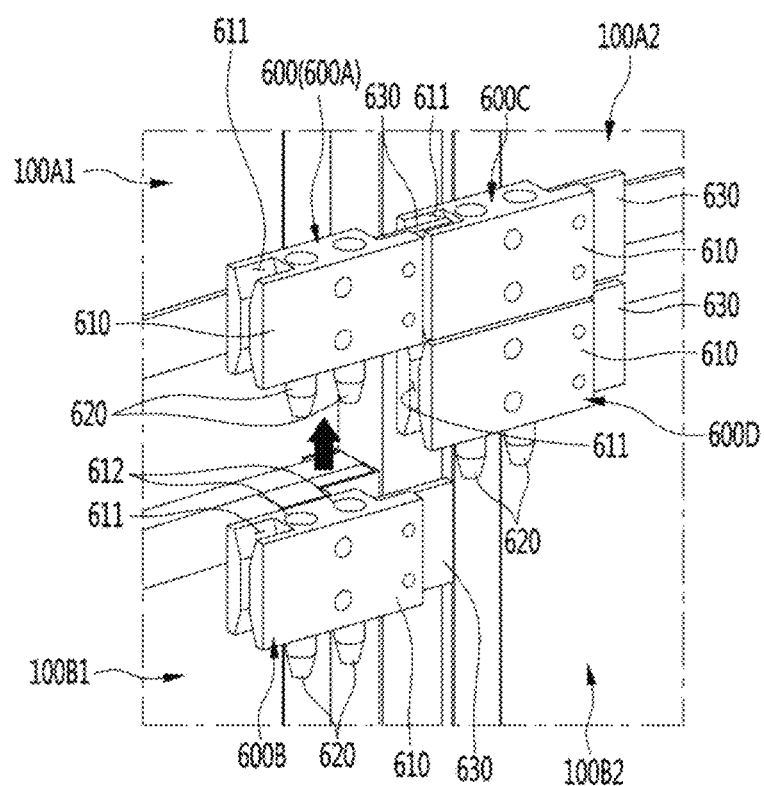
[Fig. 18]

DISPLAY DEVICE

CROSS-REFERENCE TO RELATED APPLICATIONS

This application is the National Stage filing under 35 U.S.C. 371 of International Application No. PCT/KR2019/001073, filed on Jan. 25, 2019, the contents of which are all hereby incorporated by reference herein in their entirety.

TECHNICAL FIELD

The present invention relates to a display device, and more particularly, to a display device installed on a structure such as a column.

BACKGROUND ART

As our information society develops, needs for diverse forms of display apparatus are increasing. Accordingly, research has been carried out on various display apparatuses such as liquid crystal display devices (LCDs), plasma display panels (PDPs), electro luminescent displays (ELDs), vacuum fluorescent displays (VFDs), organic light emitting diodes (OLEDs), and the like.

Among them, such an OLED panel may display an image by depositing an organic material layer that is capable of emitting light by itself on a substrate on which a transparent electrode is formed. The OLED panel is not only thin, but also has flexible characteristics. Many studies have been conducted on structural characteristics of the display device having such an OLED panel.

DISCLOSURE OF THE INVENTION

Technical Problem

One object of the present invention for solving the above problem is to provide a display device that is convenient to be assembled and disassembled.

Another object of the present invention is to provide a display device in which individual maintenance of display modules is easy.

Technical Solution

A display device according to an embodiment of the present invention may include: a display module; a reinforcement frame provided in the display module; a hook fastened to the reinforcement frame; a mounting bracket having a hook hole in which the hook is hooked; a screw that is in contact with a top or bottom surface of the reinforcement frame; and a screw fastening part which is provided on the reinforcement frame and to which the screw is fastened.

The display device may further include a control box fastened to the display module.

An opening configured to avoid an interference with the control box may be formed in the mounting bracket.

The hook may be provided in plurality, which are spaced apart from each other in a longitudinal direction of the reinforcement frame.

A display device may include: an upper display module; a lower display module disposed under the upper display module; an upper reinforcement frame provided in the upper display module; a lower reinforcement frame provided in the lower display module; an upper hook fastened to the upper reinforcement frame; a lower hook fastened to the lower reinforcement frame; an upper bracket having a hook hole in which the lower hook is hooked at an upper side; and a lower bracket having a hook hole in which the lower hook is hooked at a lower side and disposed under the upper bracket.

The display device may further include: an upper screw that is in contact with a top surface of the upper reinforcement frame; an upper screw fastening part which is provided on the upper reinforcement frame and to which the upper screw is fastened at an upper side; a lower screw that is in contact with a bottom surface of the lower reinforcement frame; and an upper screw fastening part which is provided on the lower reinforcement frame and to which the lower screw is fastened at a lower side.

The upper screw fastening part may be provided on an upper edge of the upper reinforcement frame, and the lower screw fastening part may be provided on a lower edge of the lower reinforcement frame.

The upper hook may include: a first fastening part fastened to the upper reinforcement frame; a first hook part disposed at an opposite side of the first fastening part based on the upper bracket; and a first connection part configured to connect upper ends of the first fastening part and the first hook part to each other and pass through the hook hole of the upper bracket.

The lower hook may include: a second fastening part fastened to the lower reinforcement frame; a second hook part disposed at an opposite side of the second fastening part based on the lower bracket; and a second connection part configured to connect lower ends of the second fastening part and the second hook part to each other and pass through the hook hole of the lower bracket.

The display device may further include: an upper connector provided on a lower end of each of both edges of the upper display module; and a lower connector provided on an upper end of each of both edges of the lower display module and connected to the upper connector.

Each of the upper connector and the lower connector may include: a body; an insertion pin protruding downward from the body; and an insertion groove recessed downward from a top surface of the body and having a shape into which the insertion pin is inserted.

Each of the upper connector and the lower connector may include: a fitting plate disposed at one side of the body; and a fitting groove formed in the other side of the body and having a shape into which the fitting plate is fitted.

The display device may further include: an upper control box fastened to the upper display module; and a lower control box fastened to the lower display module and disposed below the upper control box.

The upper reinforcement frame may be disposed above the upper control box, and the lower reinforcement frame is disposed below the lower control box.

Advantageous Effects

According to the preferred embodiment of the present invention, there is the advantage of simplifying the mounting/separating operations the display module on/from the mounting bracket.

In addition, the worker may easily perform the mounting/separating operation of the display module on/from the mounting bracket from the outside of the display device. As a result, there is the advantage that the separate operation space between the column and the mounting bracket is unnecessary.

In addition, the mounting bracket may be provided with the opening to avoid the interference with the control box. Accordingly, the display device may become compact.

In addition, the plurality of hooks may be disposed on the virtual vertical surface parallel to the mounting bracket. Accordingly, even when the display module is in the bent state, it may be accurately mounted on the mounting bracket.

In addition, the upper hook may be hooked at the upper side of the hook hole of the upper bracket, and the lower hook may be hooked at the lower side of the hook hole of the lower bracket. That is, the assembly directions of the upper display module and the lower display module may be opposite to each other. Accordingly, there is the advantage in that the service operation of each of the display modules is easy.

In addition, the upper screw may restrict the reinforcement frame of the upper display module with respect to the upper side. Accordingly, the upper display module may be firmly mounted on the upper bracket.

In addition, the lower screw may support the reinforcement frame of the lower display module from the lower side. As a result, the lower display module may be firmly mounted on the lower bracket.

In addition, since the lower screw rotates in one direction or the other direction, there is the advantage in that the vertical height difference between the upper display module and the lower display module may be precisely adjusted.

In addition, the upper display module and the lower display module may be connected to each other by the connector. Accordingly, the horizontal height difference between the upper display module and the lower display module may be minimized.

In addition, the pair of display modules adjacent to each other may be connected to each other by the connector. Accordingly, the horizontal height difference between the pair of display modules adjacent to each other may be minimized.

In addition, since each of the connectors includes the fitting plate, the fitting groove, the insertion pin, and the insertion groove, there is the advantage that the configuration and installation direction of all connectors are the same.

In addition, the upper reinforcement frame restricted by the upper screw may be disposed above the upper control box. Therefore, the worker may easily rotate the upper screw at the upper side of the upper display module.

In addition, the lower reinforcement frame supported by the lower screw may be disposed under the lower control box. Therefore, the worker may easily rotate the lower screw at the lower side of the lower display module.

BRIEF DESCRIPTION OF THE DRAWINGS

FIG. 1 is a view illustrating a state in which a display device is fixed to a column according to an embodiment of the present invention.

FIG. 2 is a view of the display device of FIG. 1, from which a display module is removed.

FIG. 3 is a view of the display device when viewed from the inside according to an embodiment of the present invention.

FIG. 4 is a plan view of a mounting bracket according to an embodiment of the present invention.

FIG. 5 is an exploded perspective view of an upper display module and an upper bracket according to an embodiment of the present invention.

FIG. 6 is an enlarged view of a portion "A2" of FIG. 5.

FIG. 7 is an enlarged view of a portion "A3" of FIG. 5.

FIG. 8 is a cutaway perspective view of an upper hook and a periphery of the upper hook in a state in which the upper display module is fastened to the upper bracket.

FIGS. 9a to 9d are views sequentially illustrating a method for mounting the upper display module.

FIG. 10 is an exploded perspective view of a lower display module and a lower bracket according to an embodiment of the present invention.

FIG. 11 is an enlarged view of a portion "A4" of FIG. 10.

FIG. 12 is an enlarged view of a portion "A5" of FIG. 10.

FIG. 13 is a cutaway perspective view of a lower hook and a periphery of the lower hook in a state in which the lower display module is fastened to the lower bracket.

FIGS. 14a to 14d are views sequentially illustrating a method for mounting the lower display module.

FIG. 15 is an enlarged view of a portion "A1" of FIG. 3.

FIG. 16 is a view illustrating a connector when viewed in one direction according to an embodiment of the present invention.

FIG. 17 is a view of the connector when viewed in the other direction according to an embodiment of the present invention.

FIG. 18 is a view for explaining connection between a plurality of connectors according to an embodiment of the present invention.

MODE FOR CARRYING OUT THE INVENTION

Hereinafter, detailed embodiments will be described in detail with reference to the accompanying drawings.

FIG. 1 is a view illustrating a state in which a display device is fixed to a column according to an embodiment of the present invention, FIG. 2 is a view of the display device of FIG. 1, from which a display module is removed, and FIG. 3 is a view of the display device when viewed from the inside according to an embodiment of the present invention.

A display device according to an embodiment of the present invention may be installed on an outer circumference of a column C. Hereinafter, a case in which the column C is a cylinder will be described as an example.

The display device according to an embodiment of the present invention may include a display module 100, a fixed frame 200, and a mounting bracket 300.

The display module 100 may output an image or picture. A length of the display module 100 in a horizontal direction may be less than a length in a vertical direction.

The display module 100 may be flexibly bent. In this case, an outer surface of the display module 100 may be formed to be convex, and an inner surface of the display module 100 may be formed to be concave. A curvature of each of the outer and inner surfaces of the display module 100 may be less than a curvature of the outer circumference of the column C.

It is preferable that the display module 100 is an organic light emitting diode (OLED) display module.

The display module 100 may include a display panel facing a radially outward direction of the column C and an inner plate disposed inside the display panel with respect to the radial direction of the column C. The display panel may output an image or picture. The inner plate may be fastened to a mounting bracket 300 to be described later.

The display device according to an embodiment of the present invention may include at least one display module 100, preferably, include a plurality of display modules 100.

The plurality of display modules 100 may include at least one upper display module 100A and at least one lower display module 100B.

The upper display module 100A may be disposed above the lower display module 100B. The plurality of upper display modules 100A and the plurality of lower display modules 100B may be disposed along the circumference of the column C.

A lower end of the upper display module 100A and an upper end of the lower display module 100B may be in contact with each other or have a predetermined height difference. Side ends of the pair of upper display modules 100A adjacent to each other may be in contact with each other or have a predetermined height difference. Side ends of the pair of lower display modules 100B adjacent to each other may be in contact with each other or have a predetermined height difference.

A boundary 101A between the pair of upper display modules 100A adjacent to each other may be the same vertical straight line as a boundary 101B between the pair of lower display modules 100B disposed under the pair of upper display modules 100A.

A boundary 102A between one upper and lower display module 100A and one lower display module 100B, which are vertically disposed, may be the same horizontal plane as a boundary between the other upper and lower display module 100A and the other lower display module 100B.

The fixed frame 200 may be disposed on the outer circumference of the column C. The fixed frame 200 may be fixed to the column.

The fixed frame 200 may have a vertical bar shape disposed to be elongated vertically.

It is preferable that the fixed frame 200 has high rigidity. For example, the fixed frame 220 may include a metal material such as aluminum.

The display device according to an embodiment of the present invention may include a plurality of fixed frames 200. The plurality of fixed frames 200 may be spaced apart from each other in the circumferential direction of the column C.

The mounting bracket 300 may have a substantially rectangular ring shape, but is not limited thereto.

The mounting bracket 300 may be fastened to at least one fixed frame 200. For example, the mounting bracket 300 may be fastened to the pair of fixed frames 200 adjacent to each other.

The mounting bracket 300 may be fastened to the fixed frame 200 at the outside of the fixed frame 200. That is, the fixed frame 200 may be disposed between the column C and the mounting bracket 300.

The display module 100 may be fastened to the mounting bracket 300. The display module 100 may be fastened to the mounting bracket 300 at the outside of the mounting bracket 300. That is, the mounting bracket 300 may be disposed between the fixed frame 200 and the display module 100.

The display device according to an embodiment of the present invention may include at least one mounting bracket 300, preferably, may include a plurality of mounting brackets 300. The number and position of the mounting brackets 300 may correspond to the number and position of the display panels 100.

The plurality of mounting brackets 300 may include at least one upper bracket 300A and at least one lower bracket 300B.

The upper bracket 300A may be disposed at an upper side of the lower bracket 300B. The plurality of upper brackets 300A and the plurality of lower brackets 300B may be disposed along the circumference of the column C.

The upper bracket 300A and the lower bracket 300B, which are disposed vertically, may be fastened to the same fixed frame 200. For example, the upper bracket 300A and the lower bracket 300B may be fastened to the pair of fixed frames 200 adjacent to each other.

The upper display module 100A may be fastened to the upper bracket 300A. The lower display module 100B may be fastened to the lower bracket 300B.

The display device according to an embodiment of the present invention may further include a connector 600. The connector 600 may be provided on an inner surface of the display module 100.

The connector 600 may connect the upper display module 100A to the lower display module 100B, which are disposed vertically. The connector 600 may minimize a height difference between the adjacent display modules 100. The connector 600 will be described in detail later.

FIG. 4 is a plan view of the mounting bracket according to an embodiment of the present invention.

At least one reinforcement frame 120 may be provided on the inner surface of the display module 100.

The reinforcement frame 120 may be formed to be elongated along the inner circumference of the display module 100. The reinforcement frame 120 may be disposed horizontally.

Preferably, a plurality of reinforcement frames 120 may be provided on the inner surface of the display module 100. For example, the pair of reinforcement frames 120 spaced vertically apart from each other may be provided on the inner surface of the display module 100.

The reinforcement frame 120 may reinforce the rigidity of the display module 100.

A hook 400 may be fastened to the reinforcement frame 120. In more detail, the reinforcement frame 120 may be provided with a hook fastening part 130 which protrudes inward and is fastened to the hook 400.

The hook 400 may be hooked in the hook hole 320 (see FIGS. 5 and 10) formed in the mounting bracket 300. This will be described in detail later.

A plurality of hooks 400 may be fastened to the reinforcement frame 120. For example, a pair of hooks 400 spaced horizontally apart from the reinforcement frame 120 may be fastened.

The plurality of hooks 400 fastened to the reinforcement frame 120 may be disposed on a virtual vertical surface P. The virtual vertical surface P may be parallel to the mounting bracket 300 (see FIG. 3).

Hereinafter, the hook 400 provided on the upper display module 100A is referred to as an upper hook 400A (see FIG. 5), and the hook 400 provided in the lower display module 100B is referred to as a lower hook 400B (See FIG. 10).

The upper hook 400A provided on the upper display module 100A may descend to be mounted on the upper bracket 300A, and the lower hook 400B provided on the lower display module 100B may ascend to be mounted on the lower bracket 300B. That is, the mounting directions of the upper display module 100A and the lower display module 100B may be opposite to each other.

Accordingly, when any one of the upper display module 100A and the lower display module 100B is mounted on the mounting bracket 300 or separated from the mounting bracket 300, an interference with the other one of the upper display module 100A and the lower display module 100B may be minimized. Therefore, there is an advantage in that a service operation of each of the display modules 100 is easy.

Also, there is an advantage in that it is easy to assemble/dissemble the display module 100 with/from the outside of the column C and the fixed frame 200.

FIG. 5 is an exploded perspective view of the upper display module and the upper bracket according to an embodiment of the present invention, FIG. 6 is an enlarged view of a portion "A2" of FIG. 5, FIG. 7 is an enlarged view of a portion "A3" of FIG. 5, and FIG. 8 is a cutaway perspective view of the upper hook and a periphery of the upper hook in a state in which the upper display module is fastened to the upper bracket.

Referring to FIG. 5, an upper control box 10A may be fastened to an inner surface of the upper display module 100A. In more detail, a control box fastening part 140A to which the upper control box 10A is fastened may be formed on the inner surface of the upper display module 100A. The control box fastening part 140A may protrude toward the upper control box 10A from the inner surface of the upper display module 100A.

The upper control box 10A may have a box shape that is disposed to be elongated vertically It is preferable that the control box fastening part 140A is fastened to upper and lower ends of the upper control box 10A, respectively.

The upper control box 10A may be electrically connected to the upper display module 100A. The upper control box 10A may control an image or picture displayed on the upper display module 100A. The upper control box 10A may include a main board, a power module, and a timing controller (T-con). Since an internal configuration of the upper control box 10A and a function of each of components are well-known technologies, detailed descriptions are omitted.

The plurality of reinforcement frames 120 included in the upper display module 100A may be disposed above and below the upper control box 10A. In more detail, the plurality of reinforcement frames 120 included in the upper display module 100A may include a first reinforcement frame 120A disposed above the upper control box 10A and a second reinforcement frame 120B disposed below the upper control box 10A. That is, the upper control box 10A and the control box fastening part 140A may be vertically disposed between the first reinforcement frame 120A and the second reinforcement frame 120B.

The first reinforcement frame 120A may be referred to as an upper reinforcement frame 120A.

The first reinforcement frame 120A and the second reinforcement frame 120B may be vertically spaced apart from each other.

An upper hook 400A may be fastened to the reinforcement frame 120 of the upper display module 100A. The upper hook 400A may be fastened to the first reinforcement frame 120A and the second reinforcement frame 120B.

A plurality of upper hooks 400A may be fastened to the first reinforcement frame 120A and the second reinforcement frame 120B, respectively. For example, a pair of upper hooks 400A spaced apart from each other in the horizontal direction may be fastened to the first reinforcement frame 120A and the second reinforcement frame 120B, respectively.

An outer surface of the upper bracket 300A may face an inner surface of the upper display module 100A. The inner surface of the upper bracket 300A may face the column C (see FIG. 2) and the fixed frame 200.

An opening 310A for preventing an interference with the upper control box 10A may be formed in the upper bracket 300A. The opening 310A may be formed by passing through the upper bracket 300A.

The opening 310 formed in the upper bracket 300A may be formed to have a size through which the upper control box 10A is capable of passing therethrough. Also, a shape of the opening 310A may correspond to a shape of the upper control box 10A. For example, the opening 310A may have a vertically long rectangular shape.

At least one hook hole 320 through which the upper hook 400A is hooked may be formed in the upper bracket 300A. Preferably, a plurality of hook holes 320 may be formed.

The plurality of hook holes 320 formed in the upper bracket 300A may include at least one first hook hole 320A disposed above the opening 310A and at least one second hook hole 320B disposed below the opening 310A.

A vertical distance from an upper end of the upper bracket 300A to the first hook hole 320A may be less than a vertical distance from the upper end of the upper bracket 300A to an upper end of the opening 310A. Also, a vertical distance from a lower end of the upper bracket 300A to the second hook hole 320B may be less than a vertical distance from the lower end of the upper bracket 300A to a lower end of the opening 310A.

The upper hook 400A fastened to the first reinforcement frame 120A may be hooked in the first hook hole 320A. The number and position of the first hook holes 320A may correspond to the number and positions of the upper hooks 400A fastened to the first reinforcement frame 120A. For example, the first hook hole 320A may be provided in a pair, which are spaced apart from each other in the left and right direction.

The upper hook 400A fastened to the second reinforcement frame 120B may be hooked in the second hook hole 320B. The number and position of the second hook holes 320B may correspond to the number and position of the upper hooks 400A fastened to the second reinforcement frame 120B. For example, the second hook hole 320B may be provided in a pair, which are spaced apart from each other in the left and right direction.

At least one upper screw fastening part 330 to which an upper screw 340 is fastened may be provided on an outer surface of the upper bracket 300A.

The upper screw fastening part 330 may be provided on a portion of the outer surface of the upper bracket 300A, which is adjacent to the upper end of the upper bracket 300A. In more detail, the upper screw fastening part 330 may be provided on a portion of the outer surface of the upper bracket 300A between the upper end of the upper bracket 300A and the first hook hole 320A.

When the upper display module 100A is mounted on the upper bracket 300A, the upper hook 400A fastened to the first reinforcement frame 120A may be hooked in the first hook hole 320A. The upper screw fastening part 330 may be disposed above the first reinforcement frame 120A.

In this case, the upper screw 340 may be fastened to the upper screw fastening part 330 at an upper side of the upper screw fastening part 330. The upper screw 340 may rotate and descend to be in contact with a top surface of the first reinforcement frame 120A or press the first reinforcement frame 120A downward.

Referring to FIGS. 6 and 8, the upper screw fastening part 330 may have a substantially block shape. However, this embodiment is not limited thereto. The upper screw fastening part 330 may be provided with a screw fastening hole 330A that is penetrated vertically. An inner circumference of the screw fastening hole 330A may be provided with a female screw thread engaged with a male screw thread formed on an outer circumference of the upper screw 340.

The upper screw 340 may include a head 341 and a body 342 extending downward from the head 341.

The head 341 of the upper screw 340 may be disposed above the upper screw fastening part 330. The head 341 may have a size that does not pass through the screw fastening hole 330A and is hooked on a top surface of the upper screw fastening part 330.

The body 342 of the upper screw 340 may pass through the screw fastening hole 330A. A male screw thread may be formed on outer circumference of the body 342.

A lower end of the upper screw 340 may be a lower end of the body 342. The lower end of the upper screw 340 may be in contact with a top surface of the first reinforcement frame 120A or press the top surface of the first reinforcement frame 120A downward.

Accordingly, the upper display module 100A may be restricted upward by the upper screw 340.

Referring to FIG. 7, the reinforcement frame 120 may include an upper plate 121, a lower plate 122 disposed under the upper plate 121, and a connection part 123 connecting the upper plate 121 to the lower plate 122.

Each of the upper plate 121 and the lower plate 122 may be disposed horizontally. Each of the upper plate 121 and the lower plate 122 may be formed to be elongated along the inner circumference of the display module 100.

The upper plate 121 and the lower plate 122 may be vertically spaced apart from each other. An interval between the upper plate 121 and the lower plate 122 may be constant along the inner circumference of the display module 100.

The connection part 123 may be disposed between the upper plate 121 and the lower plate 122. The connection part 123 may be fastened to each of the upper plate 121 and the lower plate 122. A cross-section of the connection part 123 may have a " ⌐ " shape.

It is preferable that the connection part 123 is provided in plurality. The plurality of connection parts 123 may be spaced apart from each other in a longitudinal direction of the reinforcement frame 120.

The hook fastening part 130 may be provided on the reinforcement frame 120. In more detail, the hook fastening part 130 may include a fixed part 131 fixed to the inside of the reinforcement frame 120 and a fastening boss 132 protruding inward from the fixed part 131.

The fixed part 131 may be disposed so that the reinforcement frame 120 disposed between the upper plate 121 and the lower plate 122.

The fastening boss 132 may protrude inward from the fixed part 131. That is, the fixed part 131 may protrude from the fixed part 131 toward the fastening bracket 300.

The upper hook 400A may be fastened to the hook fastening part 130 provided on each of the first reinforcement frame 120A and the second reinforcement frame 120B.

A cross-section of the upper hook 400A may have a shape in which a " ⌐ " shape thereof rotates at an angle of 90 degrees in a clockwise direction.

In more detail, the upper hook 400A may include a fastening part 410A fastened to the hook fastening part 130, a hook part 420A disposed inside the fastening part 410A, and a connection part 430A connecting the fastening part 410A to an upper end of the hook part 420A.

The fastening part 410A, the hook part 420A, and the connection part 430A of the upper hook 400A may be integrally formed. The connection part 430A may be bent inward from an upper end of the fastening part 410A, and the hook part 420A may be bent downward from an inner end of the connection part 430A.

Each of the fastening part 410A and the hook part 420A of the upper hook 400A may have a plate shape that is disposed substantially vertically. The hook part 420A of the upper hook 400A may be spaced apart from the fastening part 410A.

The fastening part 410A of the upper hook 400A may be formed to have a size that does not pass through the hook hole 320. That is, the size of the fastening part 410A may be greater than a size of the hook hole 320.

On the other hand, the hook part 420A of the upper hook 400A may be formed to have a size capable of passing through the hook hole 320. That is, the size of the hook part 420A may be less than the size of the hook hole 320.

Therefore, when the worker allows the upper display module 100A to approach the upper bracket 300A, the hook part 410A of the upper hook 400A may pass through the hook hole 320 and the hook part 420A, but may not pass through the hook hole 320. This may facilitate the mounting of the upper display module 100A on the upper bracket 300A.

At least a portion of the fastening part 410A of the upper hook 400A may be in contact with an outer surface of the upper bracket 300A. In more detail, a portion of a lower side of the fastening part 410A of the upper hook 400A may be formed to be stepped from a portion of the upper side of the fastening part 410A. In this case, an upper portion of the fastening part 410A may be fastened to the hook fastening part 130, and a lower part of the fastening part 410A may be in contact with the outer surface of the upper bracket 300A.

Also, at least a portion of the hook part 420A of the upper hook 400A may be in contact with the inner surface of the upper bracket 300A. Thus, the upper hook 400A may be fixed to the upper bracket 300A in the horizontal direction. That is, the upper display module 100A may be restricted in the horizontal direction with respect to the upper bracket 300A.

A lower end of the hook part 420A of the upper hook 400A may be bent to be inclined downward in an inward direction. Thus, a lower portion of an inner circumference of the hook hole 320 may be easily inserted between the hook part 420A and the fastening part 410A.

The connection part 430A of the upper hook 400A may connect an upper end of the fastening part 410A to an upper end of the hook part 420A. A bottom surface of the connection part 430A may be hooked in contact with the lower inner circumference of the hook hole 320.

Accordingly, the upper bracket 300A may support the upper hook 400A at a lower side. That is, the upper display module 100A may be restricted downward with respect to the upper bracket 300A.

FIGS. 9a to 9d are views sequentially illustrating a method for mounting the upper display module.

The worker may mount the upper display module 100A on the upper bracket 300A in a state in which the upper bracket 300A is fastened to the fixed frame 200 fixed to the column C (see FIG. 2).

As illustrated in FIG. 9a, the worker may allow the upper display module 100A to approach the upper bracket 300A so that the upper hook 400A is inserted into the hook hole 320.

In this case, the upper screw 340 may not be fastened to the upper screw fastening part 330. Alternatively, the upper screw 340 may be in a state of ascending by a predetermined height.

As described above, the hook part 420A of the upper hook 400A may pass through the hook hole 320, and the fastening part 410A may not pass through the hook hole 320, but may be hooked around the hook hole 320 on the outer surface of the upper bracket 300A.

Thereafter, the worker may allow the upper display module 100A to descend as illustrated in FIG. 9b. In this case, the lower portion of the inner circumference of the hook hole 320 may be inserted between the hook part 420A and the fastening part 410A of the upper hook 400A. The upper hook 400A may descend until the connection part 430A is in contact with the lower inner circumference of the hook hole 320. As a result, the upper display module 100A may be supported by the upper bracket 300A.

Thereafter, the worker may rotate the upper screw 340 in a direction in which the upper screw 340 descends, as illustrated in FIG. 9c.

As illustrated in FIG. 9d, the upper screw 340 may rotate until the lower end of the upper screw 340 is in contact with a top surface of the first reinforcement frame 120A or presses the upper surface of the first reinforcement frame 120A downward.

Accordingly, the mounting of the upper display module 100A on the upper bracket 300A may be completed.

FIG. 10 is an exploded perspective view of the lower display module and the lower bracket according to an embodiment of the present invention, FIG. 11 is an enlarged view of a portion "A4" of FIG. 10, FIG. 12 is an enlarged view of a portion "A5" of FIG. 10, and FIG. 13 is a cutaway perspective view of the lower hook and a periphery of the lower hook in a state in which the lower display module is fastened to the lower bracket.

Referring to FIG. 10, a lower control box 10B may be fastened to the inner surface of the lower display module 100B. In more detail, a control box fastening part 140B to which the lower control box 10B is fastened may be formed on the inner surface of the lower display module 100B. The control box fastening part 140B may protrude toward the upper control box 10A from the inner surface of the lower display module 100B.

The lower control box 10B may have a box shape that is disposed to be elongated vertically. The control box fastening part 140B may be preferably fastened to each of upper and lower ends of the lower control box 10B.

The lower control box 10B may be electrically connected to the lower display module 100B. The lower control box 10B may control an image or picture displayed on the lower display module 100B. The upper control box 10A may include a main board, a power module, and a timing controller (T-con). Since an internal configuration of the upper control box 10A and a function of each of components are well-known technologies, detailed descriptions are omitted.

The plurality of reinforcement frames 120 included in the lower display module 100B may be disposed above and below the lower control box 10B. In more detail, the plurality of reinforcement frames 120 included in the lower display module 100B may include a third reinforcement frame 120C disposed above the lower control box 10B and a fourth reinforcement frame 120D disposed below the lower control box 10B. That is, the lower control box 10B and the control box fastening part 140B may be vertically disposed between the third reinforcement frame 120C and the fourth reinforcement frame 120D.

The fourth reinforcement frame 120D may be referred to as a lower reinforcement frame 120D.

The third reinforcement frame 120C and the fourth reinforcement frame 120D may be vertically spaced apart from each other.

The lower hook 400B may be fastened to the reinforcement frame 120 of the lower display module 100B. The lower hook 400B may be fastened to the third reinforcement frame 120C and the fourth reinforcement frame 120D.

A plurality of lower hooks 400B may be fastened to the third reinforcement frame 120C and the fourth reinforcement frame 120D, respectively. For example, a pair of lower hooks 400B spaced apart from each other in the horizontal direction may be fastened to the third reinforcement frame 120C and the fourth reinforcement frame 120D, respectively.

An outer surface of the lower bracket 300B may face the inner surface of the lower display module 100B. An inner surface of the lower bracket 300B may face the column C (see FIG. 2) and the fixed frame 200.

The lower bracket 300B may have an opening 310B that prevents an interference with the lower control box 10B. The opening 310B may be formed by passing through the lower bracket 300B.

The opening 310B formed in the lower bracket 300B may be formed to have a size through which the lower control box 10B is capable of passing therethrough. Also, a shape of the opening 310B may correspond to a shape of the lower control box 10B. For example, the opening 310B may have a vertically long rectangular shape.

At least one hook hole 320 through which the lower hook 400B is hooked may be formed in the lower bracket 300B. Preferably, a plurality of hook holes 320 may be formed.

The plurality of hook holes 320 formed in the lower bracket 300B may include at least one third hook hole 320C disposed above the opening 310B and at least one fourth hook holes 320D disposed below the opening 310B.

A vertical distance from an upper end of the lower bracket 300B to the third hook hole 320C may be less than a vertical distance from an upper end of the lower bracket 300B to an upper end of the opening 310B. Also, a vertical distance from a lower end of the lower bracket 300B to the fourth hook hole 320D may be less than a vertical distance from a lower end of the lower bracket 300B to a lower end of the opening 310B.

The lower hook 400B fastened to the third reinforcement frame 120C may be hooked in the third hook hole 320C. The number and position of the third hook hole 320C may correspond to the number and position of the lower hook 400B fastened to the third reinforcement frame 120C. For example, the third hook hole 320C may be provided in a pair, which are spaced apart from each other in the left and right direction.

The lower hook 400B fastened to the fourth reinforcement frame 120D may be hooked in the fourth hook hole 320D. The number and position of the fourth hook hole 320D may correspond to the number and position of the lower hook 400D fastened to the fourth reinforcement frame 120D. For example, the fourth hook hole 320D may be provided in a pair, which are spaced apart from each other in the left and right direction.

At least one lower screw fastening part 350 to which the lower screw 360 is fastened may be provided on the outer surface of the lower bracket 300B.

The lower screw fastening part 350 may be provided at a portion of the outer surface of the lower bracket 300B, which is adjacent to the lower end of the lower bracket 300B. In more detail, the lower screw fastening part 350 may be provided at a portion of the outer surface of the lower bracket 300B between the lower end of the lower bracket 300B and the fourth hook hole 320D.

When the lower display module 100B is mounted on the lower bracket 300B, the lower hook 400B fastened to the third reinforcement frame 120C may be hooked in the third hook hole 320C. The lower screw fastening part 350 may be disposed under the fourth reinforcement frame 120D.

In this case, the lower screw 360 may be fastened to the lower screw fastening part 350 at the lower side of the lower screw fastening part 350. The lower screw 360 may rotate and ascend to be in contact with a bottom surface of the fourth reinforcement frame 120D.

Referring to FIGS. 11 and 13, the lower screw fastening part 350 may have a substantially block shape. However, this embodiment is not limited thereto. The lower screw fastening part 350 may be provided with a screw fastening hole 350A that is penetrated vertically. A female screw thread engaged with a male screw thread formed on an outer circumference of the lower screw 360 may be formed on an inner circumference of the screw fastening hole 350A.

The lower screw 360 may include a head 361 and a body 362 extending upward from the head 361.

The head 361 of the lower screw 360 may be disposed under the lower screw fastening part 350. The head 361 may have a size that does not pass through the screw fastening hole 350A and is hooked on a bottom surface of the lower screw fastening part 350.

The body 362 of the lower screw 360 may pass through the screw fastening hole 350A. A male screw thread may be formed on outer circumference of the body 362.

An upper end of the lower screw 360 may be an upper end of the body 362. The upper end of the lower screw 360 may be in contact with the bottom surface of the fourth reinforcement frame 120D to support the fourth reinforcement frame 120D at a lower side.

Accordingly, the lower display module 100B may be supported by the lower screw 360.

Referring to FIG. 12, the lower hook 400B may be fastened to the hook fastening part 130 of each of the third reinforcement frame 120C and the second reinforcement frame 120C.

A cross-section of the lower hook 400B may have a shape in which a "⌐" shape thereof rotates at an angle of 90 degrees in a counterclockwise direction.

In more detail, the lower hook 400B may include a fastening part 410B fastened to the hook fastening part 130, a hook part 420B disposed inside the fastening part 410B, and a connection part 430B connecting lower ends of the fastening part 410B and the hook part 420B to each other.

The fastening part 410B, the hook part 420B, and the connection part 430B of the lower hook 400B may be integrally formed. The connection part 430B may be bent inward from the lower end of the fastening part 410B, and the hook part 420B may be bent upward at an inner end of the connection part 430B.

The fastening part 410B and the hook part 420B of the lower hook 400B may have a plate shape that is disposed substantially vertically. The hook part 420B may be spaced apart from the fastening part 410B.

The fastening part 410B of the lower hook 400B may be formed to have a size that does not pass through the hook hole 320. That is, the size of the fastening part 410B may be greater than a size of the hook hole 320.

On the other hand, the hook part 420B of the lower hook 400B may be formed to have a size that is capable of passing through the hook hole 320. That is, the size of the hook part 420B may be less than the size of the hook hole 320.

Therefore, when the worker allows the lower display module 100B to approach the lower bracket 300B, the hook part 410B of the lower hook 400B may pass through the hook hole 320, and the fastening part 420B may not pass through the hook hole 320. This may facilitate the mounting of the lower display module 100B on the lower bracket 300B.

At least a portion of the fastening part 410B of the lower hook 400B may be in contact with the outer surface of the lower bracket 300B. In more detail, a portion of a lower side of the fastening part 410B of the lower hook 400B may be formed to be stepped from a portion of an upper side of the fastening part 410B. In this case, the lower portion of the fastening part 410B may be fastened to the hook fastening part 130, and the upper portion of the fastening part 410B may be in contact with the outer surface of the lower bracket 300B.

Also, at least a portion of the hook part 420B of the lower hook 400B may be in contact with the inner surface of the lower bracket 300B. Accordingly, the lower hook 400B may be fixed to the lower bracket 300B in the horizontal direction. That is, the lower display module 100B may be restricted in the horizontal direction with respect to the lower bracket 300B.

An upper end of the hook part 420B of the lower hook 400B may be bent to be inclined upward in an inward direction. Accordingly, an upper portion of an inner circumference of the hook hole 320 may be easily inserted between the hook part 420B and the fastening part 410B.

The connection part 430B of the lower hook 400B may connect a lower end of the fastening part 410B and a lower end of the hook part 420B. A top surface of the connection part 430B may be hooked in contact with the upper inner circumference of the hook hole 320.

Accordingly, the lower bracket 300B may limit the ascending of the lower hook 400B. That is, the lower display module 100B may be restricted upward with respect to the lower bracket 300B.

FIGS. 14a to 14d are views sequentially illustrating a method for mounting the lower display module.

The worker may mount the lower display module 100B on the lower bracket 300B in a state in which the lower bracket 300B is fastened to the fixed frame 200 fixed to the column C (see FIG. 2).

As illustrated in FIG. 14a, the worker may the lower display module 100B to approach the lower bracket 300B so that the lower hook 400B is inserted into the hook hole 320.

In this case, the lower screw 360 may not be fastened to the lower screw fastening part 350. Alternatively, the lower screw 360 may be in a state of descending by a predetermined height.

As described above, the hook part 420B of the lower hook 400B may pass through the hook hole 320, and the fastening part 410B may not pass through the hook hole 320, but may be hooked around the hook hole 320 on the outer surface of the lower bracket 300B.

Thereafter, the worker may lift the lower display module 100B upward as illustrated in FIG. 14b. In this case, the upper portion of the inner circumference of the hook hole 320 may be inserted between the hook part 420B and the fastening part 410B of the lower hook 400B. The lower hook 400B may ascend until the connection part 430B is in contact with the upper inner circumference of the hook hole 320.

Thereafter, the worker may rotate the lower screw 360 in a direction in which the lower screw 360 ascends, as illustrated in FIG. 14c.

As illustrated in FIG. 14d, the worker may rotate the lower screw 360 until an upper end of the lower screw 360 is in contact with a bottom surface of the fourth reinforcement frame 120D. Accordingly, the lower display module 100B may be supported by the lower screw 360.

Accordingly, the mounting of the lower display module 100B on the lower bracket 300B may be completed.

Thereafter, the worker may precisely adjust an installation height of the lower display module 100B by rotating the lower screw 360 in one direction or the other direction.

Accordingly, it is possible to easily adjust a height difference between the lower display module 100B and the upper display module 100A.

FIG. 15 is an enlarged view of a portion "A1" of FIG. 3, FIG. 16 is a view illustrating a connector when viewed in one direction according to an embodiment of the present invention, FIG. 17 is a view of the connector when viewed in the other direction according to an embodiment of the present invention, and FIG. 18 is a view for explaining connection between a plurality of connectors according to an embodiment of the present invention.

The display device according to an embodiment of the present invention may further include a connector 600 connecting the upper display module 100A to the lower display module 100B.

The connector 600 may be fastened to a rear surface of the display module 100. Each of the display modules 100 may be provided with a pair of connectors 600.

In more detail, a pair of connectors 600 provided in the upper display module 100A may be fastened to each of lower ends of one edge and the other edge of the rear surface of the upper display module 100A. Also, the pair of connectors 600 provided in the lower display module 100B may be fastened to upper ends of one edge and the other edge of the rear surface of the lower display module 100B, respectively.

The connector 600 provided in the upper display module 100A may be connected to the connector 600 provided in the lower display module 100B. Accordingly, a height difference between the upper display module 100A and the lower display module 100B may be minimized.

Each of the connectors 600 provided in the upper display modules 100A adjacent to each other may be connected to each other. Also, each of the connectors 600 provided in the lower display modules 100B adjacent to each other may be connected to each other. Accordingly, a height difference between the pair of display modules 100 adjacent to each other may be minimized.

Hereinafter, the configuration of the connector 600 will be described in detail with reference to FIGS. 16 and 17.

The connector 600 may include a body 610, an insertion pin 620, and a fitting plate 630.

The body 610 may have an approximately box shape. The body 610 may be disposed vertically.

The body 610 may be fastened to the display module 100. In more detail, the body 610 may have a fastening hole 614 penetrated toward the display module 100. A fastening member (not shown) such as a screw may pass through the fastening hole 614 and be fastened to the display module 100.

The fitting plate 630 may be disposed on one side of the body 610, and a fitting groove 611 may be formed on the other side of the body 610.

A protrusion 615 to which the fitting plate 630 is fastened may be formed on the body 610. The protrusion 615 may protrude from one side of the body 610 in a longitudinal direction of the body 610.

The fitting plate 630 may be disposed vertically. The fitting plate 630 may be disposed at one side of the body 610. The fitting plate 630 may protrude further laterally than the protrusion 615.

A first fastening hole 615A may be formed in the protrusion 615, and a second fastening hole 631 communicating with the first fastening hole 615A may be formed in the fitting plate 630. A fastening member (not shown) such as a screw may pass through the first fastening hole 615A and the second fastening hole 631. Accordingly, the fitting plate 630 may be fastened to the protrusion 615.

The fitting groove 611 may be recessed in the other side of the body 610. The fitting groove 611 may be formed to be elongated vertically. The fitting groove 611 may be opened to upper and lower sides.

The insertion pin 620 may protrude downward from the body 610. In more detail, a groove 613 recessed upward may be formed in a bottom surface of the body 610, and the insertion pin 620 may be fitted into the groove 613. However, the present invention is not limited thereto, and the insertion pin 620 may be formed integrally with the body 610.

An insertion groove 612 may be formed in a top surface of the body 610. The insertion groove 612 may be recessed from the top surface of the body 610 by a depth at which the insertion pin 620 is inserted.

The number and shape of the insertion grooves 620 may correspond to the number and shape of the insertion pins 612.

Hereinafter, a connection relationship between the connectors 600 will be described with reference to FIGS. 15 and 17.

Hereinafter, any one upper display module 100A is referred to as a first upper display module 100A1. Also, an upper display module 100A adjacent to the first upper display module 100A1 is referred to as a second upper display module 100A2. Also, a lower display module 100B disposed under the first upper display module 100A1 is referred to as a first lower display module 100B1. Also, a lower display module 100B disposed below the second upper display module 100A2 is referred to as a second lower display module 100B1.

Also, the connector 600 fastened to a lower edge of one edge of an inner surface of the first upper display module 100A1 is referred to as a first connector 600A. Also, the connector 600 fastened to an upper end of one edge of an inner surface of the first lower display module 100B1 is referred to as a second connector 600B. Also, the connector 600 fastened to a lower edge of the other side of an inner surface of the second upper display module 100A2 is referred to as a third connector 600C. Also, the connector 600 fastened to an upper edge of the other side of an inner surface of the second lower display module 100B2 is referred to as a fourth connector 600D.

The first connector 600A and the third connector 600C may be upper connectors 600A and 600C. The second connector 600B and the fourth connector 600D may be lower connectors 600B and 600D.

The first connector 600A may be disposed above the second connector 600B. The insertion pin 620 of the first connector 600A may be inserted into an insertion groove 612 of the second connector 600B. Accordingly, the first upper display module 100A1 and the first lower display module 100B1 may be connected to each other.

The third connector 600C may be disposed above the fourth connector 600D. The insertion pin 620 of the third connector 600C may be inserted into the insertion groove 612 of the fourth connector 600D. Accordingly, the second upper display module 100A2 and the second lower display module 100B2 may be connected to each other.

The first connector 600A may be disposed at a side of the third connector 600C. The fitting plate 630 of the first connector 600A may be fitted into the fitting groove 611 of the third connector 600C. Accordingly, the first upper display module 100A1 and the second upper display module 100A2 may be connected to each other.

The second connector 600B may be disposed at a side of the fourth connector 600D. The fitting plate 630 of the second connector 600B may be fitted into the fitting groove 611 of the fourth connector 600D. Accordingly, the first lower display module 100B1 and the second lower display module 100B2 may be connected to each other.

Due to the configuration and connection relationship of the connector 600 as described above, all the connectors 600 provided in each of the display modules 100 may have the same configuration and installation direction.

The above-disclosed subject matter is to be considered illustrative, and not restrictive, and the appended claims are intended to cover all such modifications, enhancements, and other embodiments, which fall within the true spirit and scope of the present invention.

Thus, the embodiment of the present invention is to be considered illustrative, and not restrictive, and the technical spirit of the present invention is not limited to the foregoing embodiment.

Therefore, the scope of the present invention is defined not by the detailed description of the invention but by the appended claims, and all differences within the scope will be construed as being included in the present invention.

What is claimed is:

1. A display device comprising:
a display module comprising an upper display module and a lower display module disposed under the upper display module;
a reinforcement frame provided in the display module, wherein the reinforcement frame comprises an upper reinforcement frame provided in the upper display module and a lower reinforcement frame provided in the lower display module;
a hook fastened to the reinforcement frame and comprising an upper hook fastened to the upper reinforcement frame and a lower hook fastened to the lower reinforcement frame;
a mounting bracket having a hook hole in which the hook is hooked;
a screw that is in contact with a top or bottom surface of the reinforcement frame; and
a screw fastening part which is provided on the reinforcement frame and to which the screw is fastened,
wherein the upper hook comprises:
a first fastening part fastened to the upper reinforcement frame;
a first hook part disposed at an opposite side of the first fastening part based on the upper bracket; and
a first connection part configured to connect upper ends of the first fastening part and the first hook part to each other and pass through the hook hole of the upper bracket,
wherein the lower hook comprises:
a second fastening part fastened to the lower reinforcement frame;
a second hook part disposed at an opposite side of the second fastening part based on the lower bracket; and
a second connection part configured to connect lower ends of the second fastening part and the second hook part to each other and pass through the hook hole of the lower bracket.

2. The display device according to claim 1, further comprising a control box fastened to the display module.

3. The display device according to claim 2, wherein an opening configured to avoid an interference with the control box is formed in the mounting bracket.

4. The display device according to claim 1, wherein the hook is provided in plurality, which are spaced apart from each other in a longitudinal direction of the reinforcement frame.

5. A display device comprising:
an upper display module;
an upper connector provided on a lower end of each of both edges of the upper display module;
a lower display module disposed under the upper display module;
a lower connector provided on an upper end of each of both edges of the lower display module and connected to the upper connector;
an upper reinforcement frame provided in the upper display module;
a lower reinforcement frame provided in the lower display module;
an upper hook fastened to the upper reinforcement frame;
a lower hook fastened to the lower reinforcement frame;
an upper bracket having a hook hole in which the upper hook is hooked at an upper side; and
a lower bracket having a hook hole in which the lower hook is hooked at a lower side and disposed under the upper bracket.

6. The display device according to claim 5, further comprising:
an upper screw that is in contact with a top surface of the upper reinforcement frame;
an upper screw fastening part which is provided on the upper reinforcement frame and to which the upper screw is fastened at an upper side;
a lower screw that is in contact with a bottom surface of the lower reinforcement frame; and
a lower screw fastening part which is provided on the lower reinforcement frame and to which the lower screw is fastened at a lower side.

7. The display device according to claim 6, wherein the upper screw fastening part is provided on an upper edge of the upper reinforcement frame, and
the lower screw fastening part is provided on a lower edge of the lower reinforcement frame.

8. The display device according to claim 6, further comprising:
an upper control box fastened to the upper display module; and
a lower control box fastened to the lower display module and disposed below the upper control box.

9. The display device according to claim 8, wherein the upper reinforcement frame is disposed above the upper control box, and
the lower reinforcement frame is disposed below the lower control box.

10. The display device according to claim 5, wherein the upper hook comprises:
a first fastening part fastened to the upper reinforcement frame;
a first hook part disposed at an opposite side of the first fastening part based on the upper bracket; and
a first connection part configured to connect upper ends of the first fastening part and the first hook part to each other and pass through the hook hole of the upper bracket,
wherein the lower hook comprises:
a second fastening part fastened to the lower reinforcement frame;
a second hook part disposed at an opposite side of the second fastening part based on the lower bracket; and a second connection part configured to connect lower ends of the second fastening part and the second hook part to each other and pass through the hook hole of the lower bracket.

11. The display device according to claim 5, wherein each of the upper connector and the lower connector comprises:
a body;
an insertion pin protruding downward from the body; and
an insertion groove recessed downward from a top surface of the body and having a shape into which the insertion pin is inserted.

12. The display device according to claim 11, wherein each of the upper connector and the lower connector comprises:
a fitting plate disposed at one side of the body; and
a fitting groove formed in the other side of the body and having a shape into which the fitting plate is fitted.

* * * * *